United States Patent
Rasmussen et al.

(10) Patent No.: US 7,365,973 B2
(45) Date of Patent: Apr. 29, 2008

(54) COOLING SYSTEM AND METHOD

(75) Inventors: Neil Rasmussen, Concord, MA (US);
John H. Bean, Wentzville, MO (US);
Greg R. Uhrhan, O'Fallon, MO (US);
Scott D. Buell, Lake St. Louis, MO (US)

(73) Assignee: American Power Conversion Corporation, West Kingston, RI (US)

( * ) Notice: Subject to any disclaimer, the term of this patent is extended or adjusted under 35 U.S.C. 154(b) by 164 days.

(21) Appl. No.: 11/335,856

(22) Filed: Jan. 19, 2006

(65) Prior Publication Data

US 2007/0165377 A1    Jul. 19, 2007

(51) Int. Cl.
*H05K 7/20* (2006.01)
*F24F 7/00* (2006.01)
*F25D 17/04* (2006.01)

(52) U.S. Cl. ............ 361/694; 361/724; 361/696; 361/699; 361/701; 454/184; 62/259.2

(58) Field of Classification Search ........... 361/679, 361/686–698, 720–727, 730, 732, 699–702; 454/184, 186; 165/104.21, 104.33, 121–127, 165/104.34, 80.4, 104.27; 62/259.1, 259.2, 62/267, 440, 441; 174/50, 51.2, 16.1; 236/49.3; 312/223.21, 223.3

See application file for complete search history.

(56) References Cited

U.S. PATENT DOCUMENTS

| | | | |
|---|---|---|---|
| 3,559,728 A | 2/1971 | Lyman et al. | |
| 4,127,008 A | 11/1978 | Tyree, Jr. | |
| 4,197,716 A | 4/1980 | Nussbaum | |
| 4,285,205 A | 8/1981 | Martin et al. | |
| 4,515,746 A * | 5/1985 | Brun et al. | 264/332 |
| 4,590,538 A | 5/1986 | Cray, Jr. | |

(Continued)

FOREIGN PATENT DOCUMENTS

EP    1610077 A2    12/2005

(Continued)

OTHER PUBLICATIONS

"Essential Cooling System Requirements for Next Generation Data Centers," White Paper #5, , Revision 3, Rev 2002-3, American Power Conversion, pp. 1-10.

(Continued)

*Primary Examiner*—Michael V Datskovskiy
(74) *Attorney, Agent, or Firm*—Lowris, Lando & Anastasi, LLP

(57) ABSTRACT

A system for cooling a data center includes a plurality of cooling racks, with each cooling rack including a housing and cooling system components supported by the housing. The system further includes a fluid communication system coupled to the cooling system components of the plurality of racks. The fluid communication system is configured to provide chilled coolant to and exhaust heated coolant from coolant system components of each cooling rack. The system also includes at least one controller coupled to each cooling rack of the plurality of cooling racks to control the operation of each cooling rack. The plurality of cooling racks and the fluid communication system are configured to be modular to allow placement of cooling racks in different locations in a row of equipment racks within the data center. Methods of cooling a data center are further disclosed.

2 Claims, 18 Drawing Sheets

U.S. PATENT DOCUMENTS

| | | | |
|---|---|---|---|
| 4,696,168 A | 9/1987 | Woods et al. | |
| 4,774,631 A | 9/1988 | Okuyama et al. | |
| 4,837,663 A | 6/1989 | Zushi et al. | |
| 4,911,231 A | 3/1990 | Horne et al. | |
| 5,057,968 A | 10/1991 | Morrison | |
| 5,095,712 A | 3/1992 | Narreau | |
| 5,150,580 A | 9/1992 | Hyde | |
| 5,158,132 A | 10/1992 | Guillemot | |
| 5,173,819 A | 12/1992 | Takahashi et al. | |
| 5,177,666 A | 1/1993 | Bland et al. | |
| 5,649,428 A | 7/1997 | Calton et al. | |
| 5,657,641 A | 8/1997 | Cunningham et al. | |
| 5,972,196 A | 10/1999 | Murphy et al. | |
| 6,032,472 A | 3/2000 | Heinrichs et al. | |
| 6,213,194 B1 | 4/2001 | Chrysler et al. | |
| 6,305,180 B1 * | 10/2001 | Miller et al. | 62/259.2 |
| 6,459,579 B1 | 10/2002 | Farmer et al. | |
| 6,474,087 B1 | 11/2002 | Lifson | |
| 6,494,050 B2 | 12/2002 | Spinazzola et al. | |
| 6,662,576 B1 | 12/2003 | Bai | |
| 6,668,565 B1 | 12/2003 | Johnson et al. | |
| 6,695,577 B1 | 2/2004 | Susek | |
| 6,718,781 B2 | 4/2004 | Freund et al. | |
| 6,745,590 B1 | 6/2004 | Johnson et al. | |
| 6,775,137 B2 * | 8/2004 | Chu et al. | 361/696 |
| 6,848,989 B2 | 2/2005 | Miyazaki et al. | |
| 6,859,366 B2 | 2/2005 | Fink | |
| 6,880,349 B2 | 4/2005 | Johnson et al. | |
| 6,955,058 B2 | 10/2005 | Taras et al. | |
| 6,967,283 B2 | 11/2005 | Rasmussen et al. | |
| 6,973,797 B2 | 12/2005 | Nemit, Jr. | |
| 6,980,433 B2 | 12/2005 | Fink | |
| 7,033,267 B2 | 4/2006 | Rasmussen | |
| 7,046,514 B2 | 5/2006 | Fink et al. | |
| 7,051,802 B2 * | 5/2006 | Baer | 165/299 |
| 7,106,590 B2 * | 9/2006 | Chu et al. | 361/701 |
| 7,112,131 B2 | 9/2006 | Rasmussen et al. | |
| 7,120,021 B2 * | 10/2006 | Hamman | 361/699 |
| 7,140,193 B2 | 11/2006 | Johnson et al. | |
| 7,145,772 B2 | 12/2006 | Fink | |
| 7,148,796 B2 | 12/2006 | Joy et al. | |
| 7,165,412 B1 | 1/2007 | Bean, Jr. | |
| 7,173,820 B2 | 2/2007 | Fink et al. | |
| 7,228,707 B2 | 6/2007 | Lifson et al. | |
| 7,278,273 B1 | 10/2007 | Whitted et al. | |
| 2001/0042616 A1 | 11/2001 | Baer | |
| 2003/0042004 A1 | 3/2003 | Novotny et al. | |
| 2003/0184975 A1 | 10/2003 | Steinman et al. | |
| 2004/0099747 A1 | 5/2004 | Johnson et al. | |
| 2004/0100770 A1 | 5/2004 | Chu et al. | |
| 2004/0120855 A1 | 6/2004 | Reichel et al. | |
| 2004/0190247 A1 * | 9/2004 | Chu et al. | 361/696 |
| 2005/0170770 A1 | 8/2005 | Johnson et al. | |
| 2005/0225936 A1 | 10/2005 | Day | |
| 2005/0237715 A1 | 10/2005 | Staben et al. | |
| 2005/0237716 A1 * | 10/2005 | Chu et al. | 361/696 |
| 2006/0082263 A1 | 4/2006 | Rimler et al. | |
| 2006/0102575 A1 | 5/2006 | Mattlin et al. | |
| 2006/0126296 A1 * | 6/2006 | Campbell et al. | 361/700 |
| 2006/0139877 A1 | 6/2006 | Germagian et al. | |
| 2006/0162357 A1 | 7/2006 | Fink et al. | |
| 2006/0232945 A1 * | 10/2006 | Chu et al. | 361/724 |
| 2006/0260338 A1 | 11/2006 | VanGilder et al. | |
| 2006/0276121 A1 | 12/2006 | Rasmussen | |
| 2007/0038414 A1 | 2/2007 | Rasmussen et al. | |
| 2007/0072536 A1 | 3/2007 | Johnson et al. | |
| 2007/0074537 A1 | 4/2007 | Bean et al. | |
| 2007/0076373 A1 | 4/2007 | Fink | |
| 2007/0078635 A1 | 4/2007 | Rasmussen et al. | |
| 2007/0085678 A1 | 4/2007 | Joy et al. | |
| 2007/0163748 A1 | 7/2007 | Rasmussen et al. | |
| 2007/0167125 A1 | 7/2007 | Rasmussen et al. | |
| 2007/0174024 A1 | 7/2007 | Rasmussen et al. | |

FOREIGN PATENT DOCUMENTS

| | | |
|---|---|---|
| JP | 2001-260640 A | 9/2001 |

OTHER PUBLICATIONS

Neil Rasmussen, "Avoidable Mistakes that Comprimise Cooling Performance in Data Centers and Network Rooms," White Paper #49, Rev 2003-0, American Power Conversion, pp. 1-15.

Neil Rasmussen, "Cooling Options for Rack Equipment with Side-to-Side Airflow," White Paper #50, Rev 2004-0, American Power Converison, pp. 1-14.

Neil Rasmussen, "Air Distribution Architecture Options for Mission Critical Facilities," White Paper #55, Revision 1, Rev 2003-0, American Power Conversion, pp. 1-13.

"How and Why Mission-Critical Cooling Systems Differ From Common Air Conditions," White Paper #56, Revision 2, Rev 2003-2, American Power Conversion, pp. 1-13.

Tony Evans, "Fundamental Principles of Air Conditioners for Information Technology," White Paper #57, Revision 1, Rev 2004-1, American Power Conversion, pp. 1-9.

Tony Evans, "Humidification Strategies for Data Centers and Network Rooms," White Paper #58, Rev 2004-0, American Power Conversion, pp. 1-13.

Neil Rasmussen, "Guidelines for Specification of Data Center Power Density," White Paper #120, Rev 2005-0, American Power Conversion, pp. 1-21.

Tony Evans, "The Different Types of Air Conditioning Equipment for IT Environments," White Paper #59, Rev 2004-0, American Power Conversion, pp. 1-21.

International Search Report for PCT/US2006/037772 mailed Jul. 10, 2007.

* cited by examiner

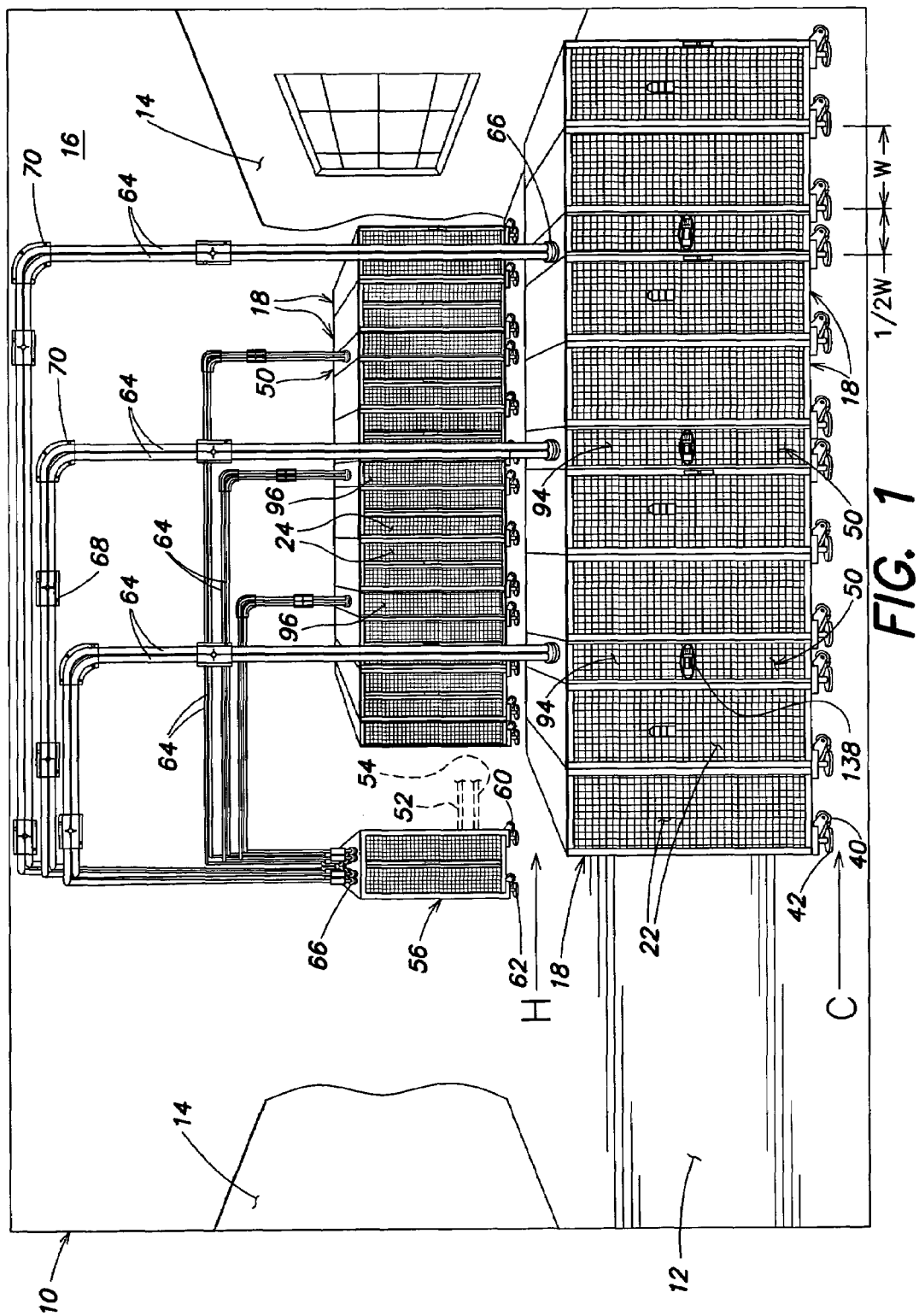

COOLING SYSTEM AND METHOD

RELATED APPLICATION

This application relates to U.S. patent application Ser. No. 11/335,874 entitled COOLING SYSTEM AND METHOD, by Neil Rasmussen, John Bean, Greg Uhrhan and Scott Buell, filed on even date herewith, and U.S. patent application Ser. No. 11/335,901 entitled COOLING SYSTEM AND METHOD, by Neil Rasmussen, John Bean, Vincent Long, Greg Uhrhan and Matthew Brown, filed on even date herewith. Both of these related applications are incorporated herein by reference.

BACKGROUND OF INVENTION

1. Field of Invention

Aspects of the present invention relate to data centers containing racks and enclosures used to house data processing, networking and telecommunications equipment, and more particularly to cooling systems and methods used to cool equipment housed by such racks and enclosures.

2. Discussion of Related Art

Equipment enclosures or racks for housing electronic equipment, such as data processing, networking and telecommunications equipment have been used for many years. Such racks are used to contain and to arrange the equipment in small wiring closets as well as equipment rooms and large data centers. In certain embodiments, an equipment rack can be an open configuration and can be housed within a rack enclosure, although the enclosure may be included when referring to a rack.

Over the years, a number of different standards have been developed to enable equipment manufacturers to design rack mountable equipment that can be mounted in standard racks manufactured by different manufacturers. A standard rack typically includes front mounting rails to which multiple units of electronic equipment, such as servers and CPUs, are mounted and stacked vertically within the rack. An exemplary industry standard rack is approximately six to six-and-a-half feet high, by about twenty-four inches wide, and about forty inches deep. Such a rack is commonly referred to as a "nineteen inch" rack, as defined by the Electronics Industries Association's EIA-310-D standard.

Nineteen inch racks are used extensively in data centers and other large facilities. With the proliferation of the Internet, it is not uncommon for a data center to contain hundreds of these racks. Further, with the ever decreasing size of computer equipment, and in particular, computer servers and blades, the number of electrical devices mounted in each rack has been increasing, raising concerns about adequately cooling the equipment.

Heat produced by rack-mounted equipment can have adverse effects on the performance, reliability and useful life of the equipment components. In particular, rack-mounted equipment, housed within an enclosure, may be vulnerable to heat build-up and hot spots produced within the confines of the enclosure during operation. The amount of heat generated by a rack of equipment is dependent on the amount of electrical power drawn by equipment in the rack during operation. In addition, users of electronic equipment may add, remove, and rearrange rack-mounted components as their needs change and new needs develop.

Previously, in certain configurations, data centers have been cooled by computer room air conditioner ("CRAC") units that are typically hard piped, immobile units positioned around the periphery of the data center room. These CRAC units intake air from the fronts of the units and output cooler air upwardly toward the ceiling of the data center room. In other embodiments, the CRAC units intake air from near the ceiling of the data center room and discharge cooler air under a raised floor for delivery to the fronts of the equipment racks. In general, such CRAC units intake room temperature air (at about 72° F.) and discharge cold air (at about 55° F.), which is blown into the data center room and mixed with the room temperature air at or near the equipment racks.

The rack-mounted equipment typically cools itself by drawing air along a front side or air inlet side of a rack, drawing the air through its components, and subsequently exhausting the air from a rear or vent side of the rack. A disadvantage of the CRAC-type air conditioning system is that cool air is mixed with the room temperature air, which is inefficient. Ideally, to make the system as efficient as possible, and to utilize as little energy and floor space as possible, the highest possible temperature air should be drawn into the CRAC units and the outlet air generated by the CRAC should be a few degrees below room temperature. In addition, airflow requirements can vary considerably as a result of different numbers and types of rack-mounted components and different configurations of racks and enclosures.

For large data centers requiring CRAC units at or near the middle or center of the data center room, delivery of coolant to the CRAC units must be located within the raised floor since it is undesirable to secure coolant piping to the ceiling of the data center due to risks involved with the possible failure of the piping joints. Specifically, with traditional CRAC systems, the piping of the units requires significant cutting and hand soldering of pipes. Leaks are common and leaking water or coolant in a data center may result in risk of damage to equipment housed within the equipment racks. In addition, the potential of earthquakes may shake the pipes and cause the joints to fail. For at least these reasons, most data center designers and operators are unwilling to consider overhead piping for cooling a data center.

SUMMARY OF INVENTION

A first aspect of the invention is directed to a system for cooling a data center having a volume of space designed to house a plurality of electronic equipment racks, with each equipment rack being adapted to support at least one piece of electronic equipment and having an industry-standard width. The system comprises at least one cooling rack comprising a housing having a width approximately one-half the width of each of the plurality of equipment racks. The system further includes cooling system components supported by the housing.

Embodiments of the system may further comprise a distribution box adapted to deliver chilled coolant to the at least one cooling rack and to receive heated coolant from the at least one cooling rack. The system may further comprise comprising a fluid communication system adapted to connect the at least one cooling rack to the distribution box. In one embodiment, the fluid communication system comprises flexible tubing and support members to support the flexible tubing. The flexible tubing includes at least one length of flexible tubing having a first coupling adapted to mate with the at least one cooling rack and a second coupling adapted to mate with the distribution box. The system may further include a controller to control operation of the at least one cooling rack and the distribution box. The cooling system components may comprise a heat exchanger housed within the housing of the at least one cooling rack, with the at least one cooling rack being configured to draw warm air over the heat exchanger to cool the warm air. A control valve may be operably coupled to the controller to control flow of coolant to the at least one cooling rack. In addition, a monitor may be operably coupled to the controller to measure environmental conditions of the volume of space. The arrangement is such that the controller is configured to control the operation of the cooling system components based on the environmental conditions of the volume of space. In one embodiment, the controller may be disposed within the at least one cooling rack. The at least one cooling rack may be a plurality of cooling racks. The distribution box may be configured to deliver chilled coolant to the plurality of cooling racks and to receive heated coolant from the plurality of cooling racks, with the controller to control operation of the plurality of cooling racks and the distribution box. In another embodiment, the controller is a main controller provided in one of the plurality of cooling racks. In yet another embodiment, a controller is operably coupled to the at least one cooling rack, wherein the controller is configured to determine the cooling capacity of the at least one cooling rack. The housing of the at least one cooling rack may include casters, coupled to the housing, to roll the housing along a generally horizontal surface.

A second aspect of the invention is directed to a method of cooling a data center. The method comprises arranging a plurality of equipment racks in a row, with each equipment rack being adapted to support at least one piece of electronic equipment and having an industry-standard width. The method further comprises positioning a cooling rack between two equipment racks of the plurality of equipment racks. The cooling rack comprises a housing adapted to support components of a cooling system, with the housing having a width approximately one-half the width of one of the plurality of equipment racks. The method further comprises delivering coolant to the cooling rack.

Embodiments of the method may further comprise controlling flow of coolant delivered to the cooling rack. The method may also comprise monitoring environmental conditions within the data center, and monitoring a cooling capacity of the cooling rack. The row of the plurality of equipment racks may be arranged to create a cool aisle in front of the plurality of equipment racks and a hot aisle in back of the plurality of equipment racks. The method may also comprise drawing air from the hot aisle into the cooling rack, cooling the drawn air, and exhausting the cooled air to the cool aisle. In one embodiment, the method may further comprise directly drawing air from the equipment rack into the cooling rack. The plurality of cooling racks may be positioned within the data center. The method may further include controlling the operation of the plurality of cooling racks. Furthermore, the method may include monitoring environmental conditions within the data center, and selectively controlling the operation of each of the plurality of racks based on environmental conditions within the data center.

A third aspect of the invention is directed to a system for cooling an electronic equipment rack adapted to support at least one piece of electronic equipment, with the equipment rack comprising a housing having a front, a back, two sides, a bottom and a top, the housing of the equipment rack having an industry-standard width. The system comprises a cooling rack including a housing having a front, a back, two sides, a bottom and a top, the housing of the cooling rack having a width approximately one-half the width of the equipment rack. The cooling rack is constructed and arranged to be positioned next to the equipment rack in such a manner that a side of the cooling rack is adjacent to a side of the equipment rack and that the fronts and the backs of the equipment rack and the cooling rack lie along substantially same planes. The system further includes cooling system components supported by the housing of the cooling rack, and a back plenum secured to the backs of the equipment rack and the cooling rack. The back plenum is adapted to isolate air within the equipment rack so that the cooling rack cools the air.

Embodiments of the system further comprise a front plenum secured to the fronts of the equipment rack and the cooling rack. In one embodiment, components of the cooling system are adapted to draw warm air from the back of the equipment rack to the back of the cooling rack through the back plenum, and the components of the cooling system are further adapted to cool the warm air delivered to the back of the cooling rack and deliver the cooled air to the front of the cooling rack and to the front of the equipment rack. The system may further comprise a distribution box adapted to deliver chilled coolant to the cooling rack and receive heated coolant from the cooling rack. In addition, the system may further comprise a fluid communication system adapted to connect the cooling rack to the distribution box. In another embodiment, the fluid communication system comprises flexible tubing, wherein the flexible tubing includes at least one length of flexible tubing having a first coupling adapted to mate with the at least one cooling rack and a second coupling adapted to mate with the distribution box. The fluid communication system may further comprise support members to support the flexible tubing. A controller is operably coupled to the cooling rack to control the operation of the cooling rack. Cooling system components may comprise a heat exchanger housed within the housing of the cooling rack, with the cooling rack being configured to draw warm air over the heat exchanger to cool the warm air under the direction of the controller. A control valve may be operably coupled to the controller to control flow of coolant to the at least one cooling rack. In addition, a monitor may be operably coupled to the controller to measure environmental conditions of the volume of space. The arrangement is such that the controller is configured to control the operation of the cooling system components based on the environmental conditions of the volume of space. In one embodiment, the controller may be disposed within the at least one cooling rack. The at least one cooling rack may be a plurality of cooling racks. The distribution box may be configured to deliver chilled coolant to the plurality of cooling racks and to receive heated coolant from the plurality of cooling racks, with the controller to control operation of the plurality of cooling racks and the distribution box. In another embodiment, the controller is a main controller provided in one of the plurality of cooling racks. In yet another embodiment, a controller is operably coupled to the at least one cooling rack, wherein the controller is configured to determine the cooling capacity of the at least one cooling rack. The housing of the at least one cooling rack may include casters, coupled to the housing, to roll the housing along a generally horizontal surface.

A fourth aspect of the invention is directed to a method of cooling an electronic equipment rack adapted to support at least one piece of electronic equipment, with the equipment rack comprising a housing having a front, a back, two sides, a bottom and a top, the housing of the equipment rack having an industry-standard width. The method comprises positioning a cooling rack next to the equipment rack, with the cooling rack comprising a housing having a front, a back, two sides, a bottom and a top, the housing of the cooling rack supporting components of a cooling system and having a width approximately one-half the width of the equipment rack. The cooling rack is constructed and arranged to be positioned next to the equipment rack in such a manner that a side of the cooling rack is adjacent to a side of the equipment rack and that the fronts and the backs of the equipment rack and the cooling rack lie along substantially same planes. The method further comprises securing a back plenum to the backs of the equipment rack and the cooling rack and delivering coolant to the cooling rack. The front and back plenums are adapted to isolate air within the equipment rack so that the cooling rack cools the air.

Embodiments of the method may include securing a front plenum to the fronts of the equipment rack and the cooling rack. The method may further comprise controlling flow of coolant delivered to the cooling rack and/or monitoring the temperature of air within the equipment rack.

A fifth aspect of the invention may be directed to a system for cooling a data center having a volume of space designed to house a plurality of electronic equipment racks, with each equipment rack being arranged in a row and having a housing adapted to support at least one piece of electronic equipment. The system comprises a plurality of cooling racks, with each cooling rack comprising a housing and cooling system components supported by the housing. The system further comprises a fluid communication system coupled to the cooling system components of the plurality of racks. The fluid communication system is configured to provide chilled coolant to and exhaust heated coolant from coolant system components of each cooling rack. The system also comprises at least one controller coupled to each cooling rack of the plurality of cooling racks to control the operation of each cooling rack. The plurality of cooling racks and the fluid communication system are configured to be modular to allow placement of cooling racks in different locations in a row of equipment racks within the volume of space of the data center.

Embodiments of the system may further include a distribution box adapted to deliver chilled coolant to and to receive heated coolant from each of the plurality of cooling racks, with the fluid communication system comprising flexible tubing. The flexible tubing may include, for each of the plurality of cooling racks, at least one length of flexible tubing having a first coupling adapted to mate with the cooling rack and a second coupling adapted to mate with the distribution box. The fluid communication system further comprises support members to support the flexible tubing. The cooling system components may comprise a heat exchanger housed within the housing of each of the plurality of cooling racks, with each of the plurality of the cooling racks being configured to draw warm air over the heat exchanger to cool the warm air. In one embodiment, the system further comprises a control valve operably coupled to the controller to control flow of coolant to the at least one cooling rack. The system may further comprise a monitor operably coupled to the controller to measure environmental conditions of the volume of space. The controller may be configured to determine the cooling capacity of each cooling rack and display the capacity on the monitor. The controller may be disposed within one of the plurality of cooling racks, wherein the controller is a main controller provided in one of the plurality of cooling racks. The housing of each of the plurality of cooling racks includes casters, coupled to the housing, to roll the housing along a generally horizontal surface.

A sixth aspect of the invention is directed to kit for cooling a data center having a volume of space designed to house a plurality of electronic equipment racks, with each equipment rack being adapted to support at least one piece of electronic equipment. The kit comprises at least one cooling rack comprising a housing and a cooling system comprising a heat exchanger located in the housing of the at least one cooling rack. The kit further comprises a fluid communication system comprising flexible tubing to connect to the heat exchanger of the at least one cooling rack.

Embodiments of the kit may further comprise at least one distribution box adapted to distribute coolant to flexible tubing, wherein the flexible tubing includes at least one length of flexible tubing having a first coupling adapted to mate with the at least one cooling rack and a second coupling adapted to mate with the distribution box. The kit may also comprise a controller to control the flow of coolant from the at least one distribution box to the at least one cooling rack and a control valve operably coupled to the controller to control flow of coolant. The kit may also include a monitor operably coupled to the controller to measure environmental conditions of the volume of space. At least one support member may be used to support the flexible tubing within the data center. The housing of the at least one cooling rack may include casters, coupled to the housing, to roll the housing along a generally horizontal surface. In one embodiment, the at least one cooling rack has a width approximately one-half the width of the equipment rack. At least one fan may be provided, wherein the at least one fan is adapted to be releasably secured to the housing of the at least one cooling rack and configured to draw warm air over the heat exchanger to cool the warm air.

A seventh aspect of the invention is directed to a method comprising: designing a cooling system for a data center; selecting components of the cooling system including a cooling rack, flexible tubing, and a coupling to connect the flexible tubing to the cooling rack; and packaging the components of the cooling system.

Embodiments of the method may comprise shipping the packaged components of the cooling system and/or installing the cooling system. In one embodiment, the step of selecting components of the cooling system further includes selecting a distribution box adapted to distribute coolant, selecting a controller to control the flow of coolant from the distribution box to the at least one cooling rack, and/or selecting a support member used to support the flexible tubing within the data center.

An eighth aspect of the invention is directed to a fluid communication system for providing coolant to and exhausting coolant from a cooling unit. The fluid communication system comprises flexible tubing and a plurality of support members. Each support member is configured to be secured to a support structure and to be releasably secured to the flexible tubing. Each support member comprises a first part and a mating second part, with the first and second parts being configured to be secured to one another with the flexible tubing disposed in between.

Embodiments of the fluid communication system include configuring each support member to secure two lengths of flexible tubing. Each of the first and second parts of each support member may have two flanges, with the flanges of the first part being adapted to mate with and secure the first part to the flanges of the second part. Each flange of each of the first and second part of each support member may have an anti-rotation boss and a boss receptacle. The arrangement is such that the boss of a flange is adapted to be received within a boss receptacle of a flange of a mating part. Each support member may be adapted to be releasably secured to another support member. Each of the first and second parts may have a surface and an interconnect provided on the surface. The arrangement is such that the interconnect of the first part is releasably inserted into a mating interconnect of the second part to attach a support member to another support member. The interconnect may be configured as one of a dovetail attachment and a dovetail receptacle and each support member may be configured to be secured to a support rod. The fluid communication system may further comprise a distribution box adapted to deliver chilled coolant to and to receive heated coolant from the flexible tubing. The flexible tubing may comprise a polyethylene inner layer, an aluminum center layer, and a polyethylene outer layer. A layer of insulation may be applied over the flexible tubing.

A ninth aspect of the invention is directed to a method of installing a fluid communication system of a cooling system of the type comprising a cooling unit and a source adapted to provide chilled coolant to the cooling unit. The method comprises providing a fluid communication system comprising a length of flexible tubing having two opposite ends, and a plurality of support members to support the flexible tubing; connecting one end of the length of flexible tubing to the source; connecting the other end of the length of flexible tubing to the cooling unit; releasably connecting the plurality of support members to the length of flexible tubing; and attaching the support members to a structure.

Embodiments of the method may further include applying an insulation layer over the length of flexible tubing. In one embodiment, the step of releasably connecting the plurality of support members to the length of flexible tubing, for each support member, comprises securing first and second mating parts of the support member over the flexible tubing. The step of securing first and second mating parts of the support member over the flexible tubing may further comprise comprises tying the first and second parts together with at least one zip tie, or may comprise screwing the parts together with at least one screw fastener. In another embodiment, the fluid communication system may comprise a length of flexible tubing having two opposite ends and a continuous length sufficient to connect the cooling unit to the source.

BRIEF DESCRIPTION OF DRAWINGS

The accompanying drawings, are not intended to be drawn to scale. In the drawings, each identical or nearly identical component that is illustrated in various figures is represented by a like numeral. For purposes of clarity, not every component may be labeled in every drawing. In the drawings:

FIG. 1 is a perspective view of a portion of a data center incorporating a cooling system of an embodiment of the present invention;

DETAILED DESCRIPTION

Figure 1A:
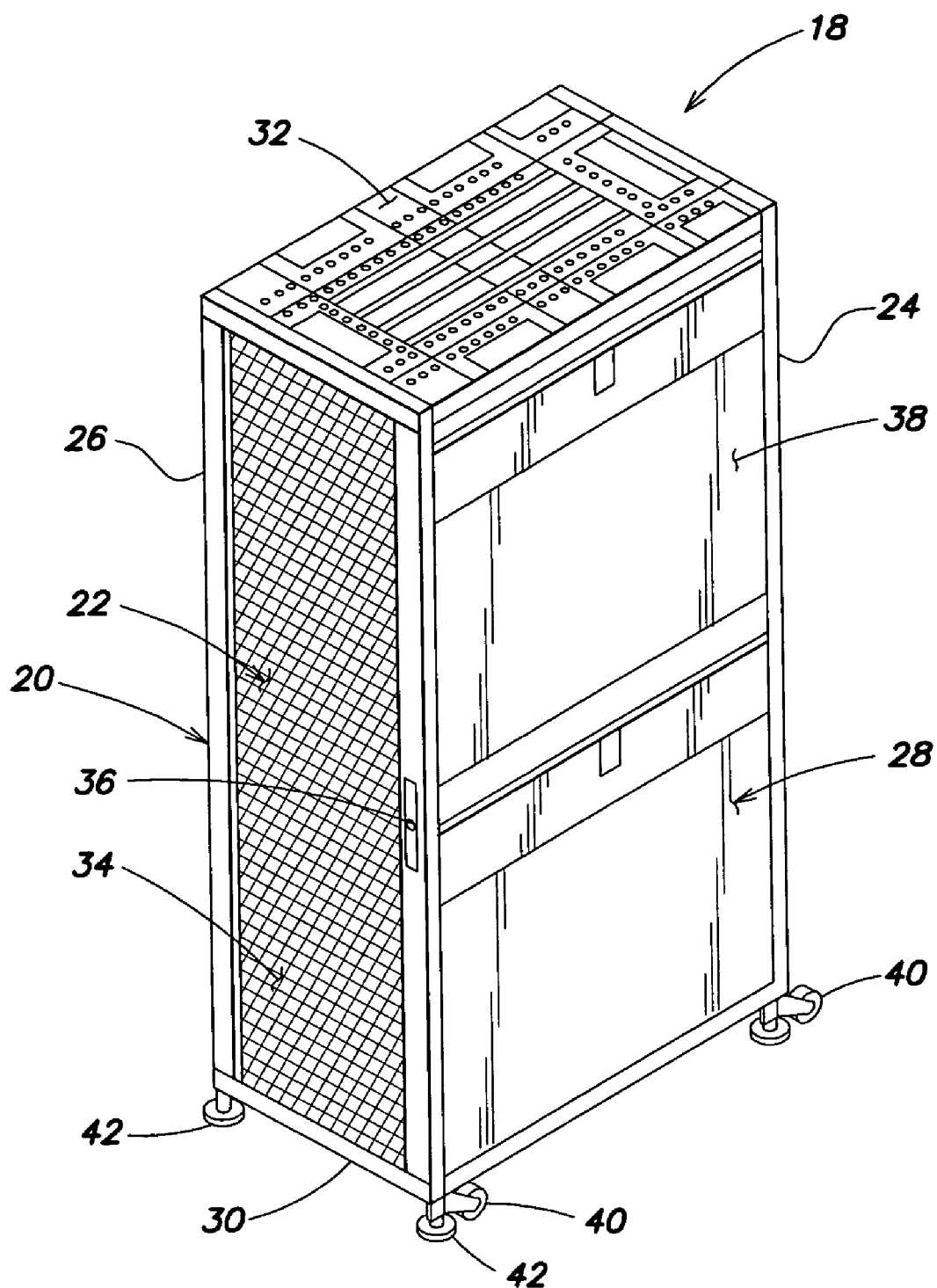
FIG. 1A is a perspective view of an equipment rack.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," "having," "containing", "involving", and variations thereof herein, is meant to encompass the items listed thereafter and equivalents thereof as well as additional items.

At least one embodiment of the present invention is directed to a modular cooling system that is selectively configurable to cool electronic equipment housed within equipment enclosures or racks of a data center. As used herein, "enclosures" and "racks" are used to describe apparatus designed to support electronic equipment. Such a cooling system is capable of employing one or more cooling racks on an as needed basis to provide localized cooling within the data center. Specifically, multiple cooling racks may be interspersed in a row of equipment racks to more efficiently cool the data center. The circulation path of warm air generated by the electronic equipment is greatly reduced, thereby nearly eliminating the mixing of hot and cold air within the data center.

Data centers are typically large rooms designed, in certain instances, to house hundreds of electronic equipment racks arranged in rows within the data center. The rows of equipment racks are arranged in such a manner that there are cold aisles and hot aisles. The cold aisles provide access to the fronts of the enclosures where the electronic equipment is typically accessed. The hot aisles provide access to the backs of the equipment racks. As requirements change, the number of equipment racks may be increased or decreased depending on the functional requirements of the data center. At least one embodiment of the present invention is modular and scaleable, and may take the form of a kit designed to meet these changing needs. Also, although relatively large data centers are discussed as an intended use for such a cooling system, as mentioned above, the system of the present invention is scaleable and may be employed in smaller rooms on a smaller scale.

In one embodiment, the cooling system may comprise a plurality of cooling racks, each cooling rack having a housing adapted to support components of the cooling system. For example, the components of the cooling system may include a heat exchanger coupled to a distribution box to deliver coolant to the heat exchanger and to return heated coolant from the heat exchanger. Fans may be provided to move air across the heat exchanger. The cooling rack may be disposed within a row of equipment racks and configured to intake the hot air within the data center from a hot aisle, for example, to cool the air to slightly below ambient temperature. This configuration eliminates the inefficiency of mixing hot air with the room temperature air to obtain a warm mixture. This configuration also decreases the latent cooling provided by the data center's air conditioning system thereby decreasing the need for humidification.

In certain embodiments, the cooling rack may be one-half the width of a standard size nineteen inch equipment rack, e.g., twelve inches in width, and may be modular so that the cooling rack may be inserted into a row of equipment racks in a matter of minutes by data center employees who have no particular heating and cooling training or specialization. The components of the cooling rack and the entire cooling system may be provided in kit form so that the person installing the cooling system does not require specialized tools. The modular nature of the cooling system allows the user to optimize the location of each cooling rack since each cooling rack includes the ability to sense and display the capacity of the system, the flow rate, coolant and air inlet and outlet temperatures, and pressure differentials. Thus, the cooling system may be employed and redeployed for maximum efficiency and use within the data center.

Turning now to the drawings, and more particularly to FIG. 1, there is shown a portion of a typical data center, generally indicated at 10. As shown, the data center 10 includes a room defined by a floor 12, walls, each indicated at 14, and a ceiling 16. The data center 10 is designed to house a plurality of equipment racks, each generally indicated at 18. In one embodiment, each equipment rack 18 may be constructed in accordance with the teachings disclosed in U.S. patent application Ser. No. 10/990,927, entitled EQUIPMENT ENCLOSURE KIT AND ASSEMBLY METHOD, filed on Nov. 17, 2004, which is owned by the assignee of the present invention and is incorporated herein by reference. Further, although not shown specifically in FIG. 1, cabling between the equipment racks 18 may be implemented using cable distribution troughs contained on the roofs of the racks as disclosed in U.S. Pat. No. 6,967,283, which is incorporated by reference and assigned to the assignee of the present invention.

Specifically, and with reference to FIG. 1A, the equipment rack 18 includes a frame or housing 20 adapted to support electronic components, such as data processing, networking and telecommunications equipment. The housing includes a front 22, back 24, sides 26, 28, bottom 30 and top 32. The front 22 of each equipment rack 18 includes a front door 34 so as to enable access into the interior of the equipment rack. A lock 36 may be provided to prevent access into the interior of the equipment rack 18 and the equipment housed by the rack. The sides 26, 28 of the equipment rack 18 may include at least one panel 38 configured to cover a side to enclose the interior region of the rack. Although not illustrated in FIG. 1, the back 24 of the equipment rack 18 may also include at least one panel or a back door to provide access to the interior of the equipment rack from the back of the rack. In certain embodiments, the side and back panels, as well as the front door and the rear door, may be fabricated from perforated sheet metal, for example, to allow air to flow into and out of the interior region of the equipment rack. Otherwise, the panels may be fabricated from solid material.

The equipment racks 18 are modular in construction and configured to be rolled into and out of position, e.g., within a row of the data center. Casters 40 are secured to the bottom of each equipment rack to enable the rack to roll along the floor of the data center. Once positioned, leveling feet 42 may be deployed to securely ground the equipment rack 18 in place within the row. An example of casters 40 and leveling feet 42 employed on such an equipment rack 18 is disclosed in detail in U.S. patent application Ser. No. 10/990, 927.

Once in position, electronic equipment may be positioned in the interior region of the equipment rack 18. For example, the equipment may be placed on shelving secured within the interior region of the equipment rack 18. Although not illustrated in FIG. 1, cables providing electrical and data communication may be provided through the top of the equipment rack 18 either through a cover (or "roof" as described in U.S. Pat. No. 6,967,283) at the top 32 of the equipment rack having openings formed therein or through an open top of the equipment rack. In this embodiment, the cables may be strung along the roofs of the rack or be provided in the aforementioned cable distribution trough. In another embodiment, the cables may be disposed within a raised floor and connected to the electronic equipment through the bottom of the equipment rack 18. With both configurations, power and communication lines are provided to the equipment racks 18.

As discussed above, and with continued reference to FIG. 1, data centers 10 are typically configured with rows of equipment racks arranged such that cool air is drawn into the racks from a cool aisle C and warm or hot air is exhausted from the racks into a hot aisle H. For illustration purposes only, the equipment racks 18 are arranged in FIG. 1 in two rows with the fronts 22 of the equipment racks in the near row being arranged in a forward direction as viewed in FIG. 1 and the backs 24 of the equipment racks in the far row being arranged in a rearward direction as viewed in FIG. 1. However, as stated above, in a typical data center, there are multiple rows of equipment racks 18 wherein the rows may be arranged with the fronts of the equipment racks facing one another to define the cold aisle and with the backs of the equipment racks facing one another to define the hot aisle.

In order to address the heat build-up and hot spots within the data center 10, and to address climate control issues within the data center in general, a modular cooling system is provided in one embodiment. As shown in FIG. 1, the cooling system comprises a plurality of cooling racks, each generally indicated at 50, disposed within the data center 10. As shown, the arrangement is such that there is a cooling rack 50 for every two equipment racks 18 provided in the data center 10. However, it should be understood that a person of ordinary skill in the art, given the benefit of this disclosure, may provide more or less cooling racks 50 within the data center 10 depending on environmental conditions of the data center. Further in some embodiments, the concentration and locations of cooling racks may be adjusted based on the locations of the hottest racks in the data center, or based on information obtained and analyzed by a data center information management system.

Figure 1B:
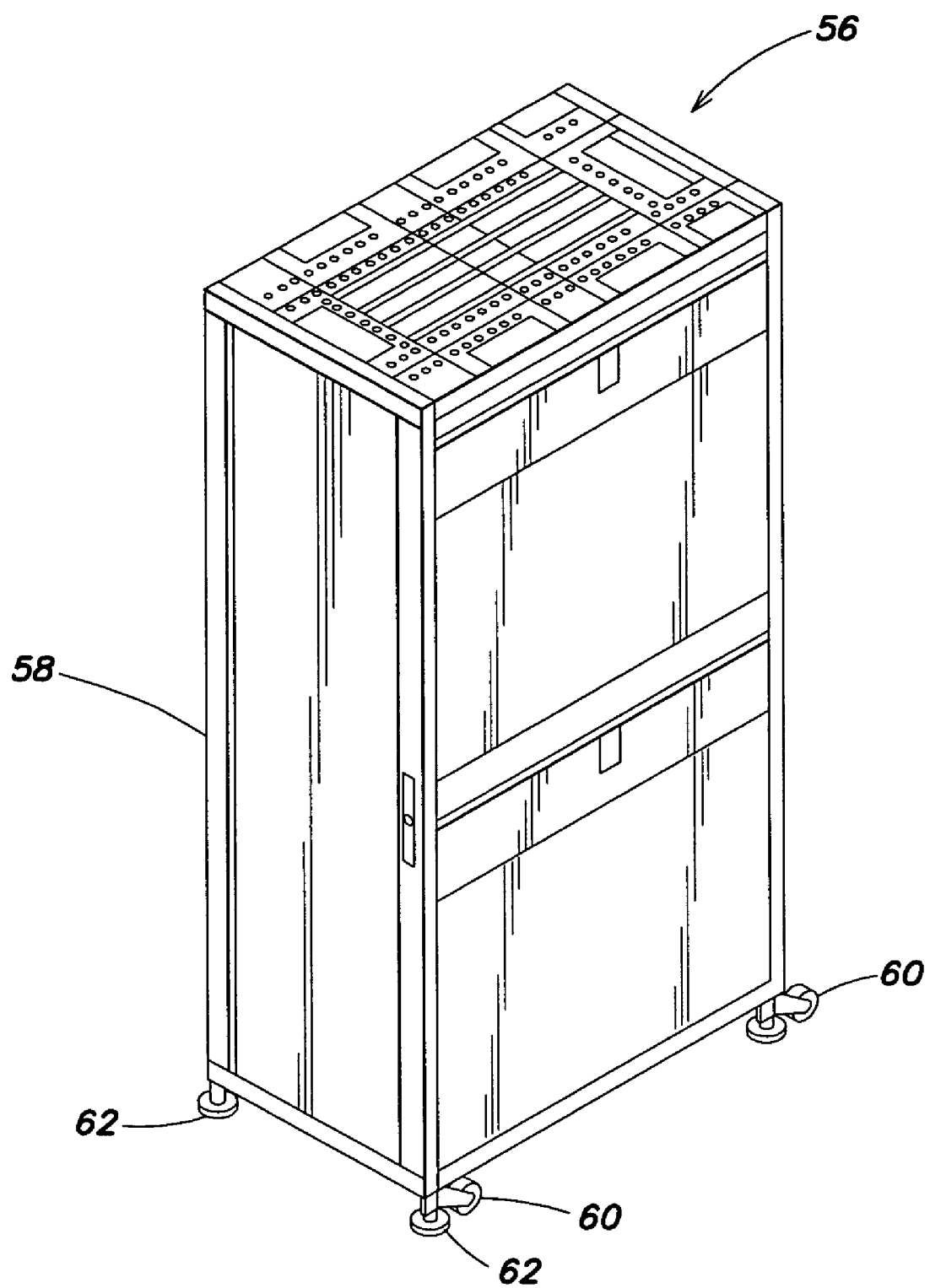
FIG. 1B is a perspective view of a distribution box of an embodiment of the present invention.

The data center 10 preferably has a coolant medium inlet 52 and a coolant medium outlet 54 adapted to deliver and return a coolant medium (e.g., water, a glycol solution or a liquid coolant, such as R134A and R410A coolants) from a suitable source, such as a chiller unit, which will be discussed in greater detail below. Specifically, the coolant medium inlet 52 is adapted to deliver chilled or cooled coolant to the data center 10, whereas the coolant medium outlet 54 is adapted to exhaust heated coolant from the data center. The inlet 52 and outlet 54 are in fluid communication with a manifold or distribution box generally indicated at 56. With reference to FIG. 1B, the distribution box 56 includes an enclosure 58 positioned in the data center 10. The configuration of the coolant medium inlet 52 and outlet 54 and the distribution box 56 will be described with reference to FIG. 2 below. As shown, the enclosure 58 may be constructed similarly to the equipment rack 18. The distribution box 56 is designed to distribute chilled coolant to and to accept heated coolant from each cooling rack 50. In certain embodiments, the distribution box 56 may be conveniently located within the data center 10, and in other embodiments, may be located outside the data center. In order to facilitate its positioning, the enclosure 58 of the distribution box 56 may be provided with casters 60 and leveling feet 62, similar to the casters 40 and leveling feet 42 of the equipment rack 18. FIG. 1 illustrates the distribution box 56 positioned near the equipment racks 18 and the cooling racks 50 of the data center 10.

It should be observed that a distribution box may, in certain embodiments, be fixed within the data center 10. For example, a distribution box may be attached to a wall 14 or other surface (e.g., the ceiling 16) inside or outside the data center 10. The provision of a movable distribution box 56 enable the cooling system of the present invention to better accommodate rooms of various shapes and sizes as well as rooms requiring varying cooling needs. In addition, it should be noted that more than one distribution box 56 may be provided in large data rooms to accommodate many cooling racks, for example, or in circumstances requiring excessive cooling.

The distribution box 56 is connected to a plurality of flexible tubes or tubing, each indicated at 64, with two flexible tubes 64 being provided for each cooling rack 50. The flexible tubing 64 is capable of bending and otherwise being manipulated to conform to the structure of the data center room 10. Typically, the flexible tubing 64 must be sufficiently flexible so that it conforms to the walls 14 and ceiling 16 of the data center 10. As shown, suitable couplings, each indicated at 66, connect the ends of the flexible tubing 64 to the distribution box 56 and to its respective cooling rack 50. Each flexible tube 64 has crimped terminal ends that are used to connect each tube to the distribution box 56 and the cooling rack 50 in the well-known manner with the couplings 66 securing the terminal ends of the flexible tube in place. In one embodiment, the couplings may be of the type sold by Wirsbo Company, of Apple Valley, Minn. The connectors and couplings are connected to the distribution box 56 by NPT one-inch connectors, and connect to the flexible tubing 64 by a crush or crimp connection. A special tool may be required to make this connection.

As mentioned above, the flexible tubing 64 may be pre-cut to a particular length based on the design layout of the data center room. Otherwise, the flexible tubing 64 may be cut onsite to a particular length. Support members, such as support members 68, as well as clamps, such as 90° clamps 70 and 45° clamps 72, are further provided for securing the flexible tubing 64. As shown, the support members 68 are configured to support the flexible tubing from the ceiling and the 90° clamps 70 and the 45° clamps 72 (not shown in FIG. 1, but illustrated in FIG. 13) may be used to connect the flexible tubing 64 to the wall of the data center 10, or any other suitable structure. The support members 68 are designed to connect the inlet and the outlet flexible tubing 64 for each cooling rack 50 to one another to create a uniform and neat appearance. The support members 68 may also be employed on large, straight sections of flexible tubing 64 along the ceiling.

Figure 1C:
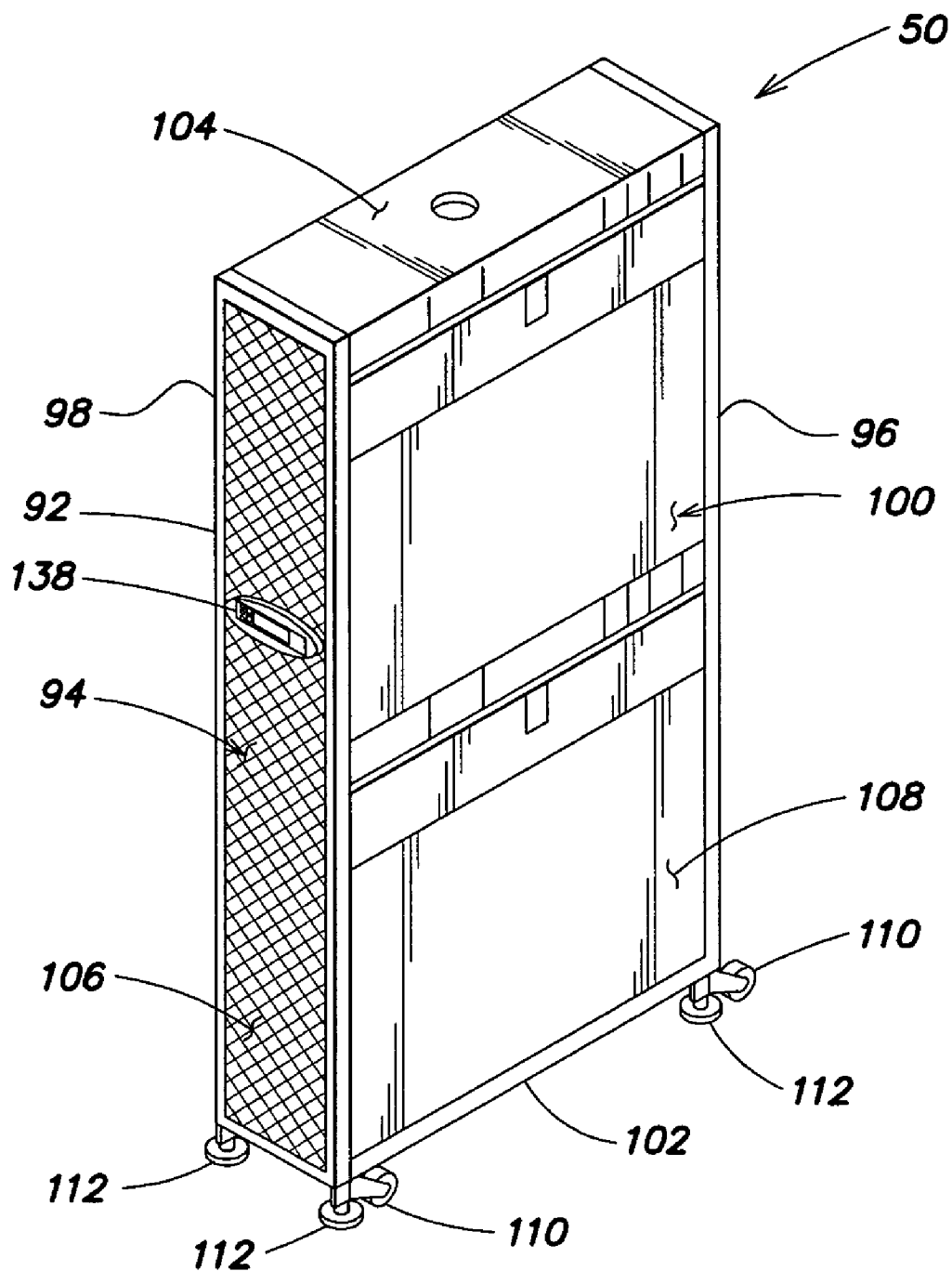
FIG. 1C is a perspective view of a cooling rack of an embodiment of the present invention.
Figure 2:
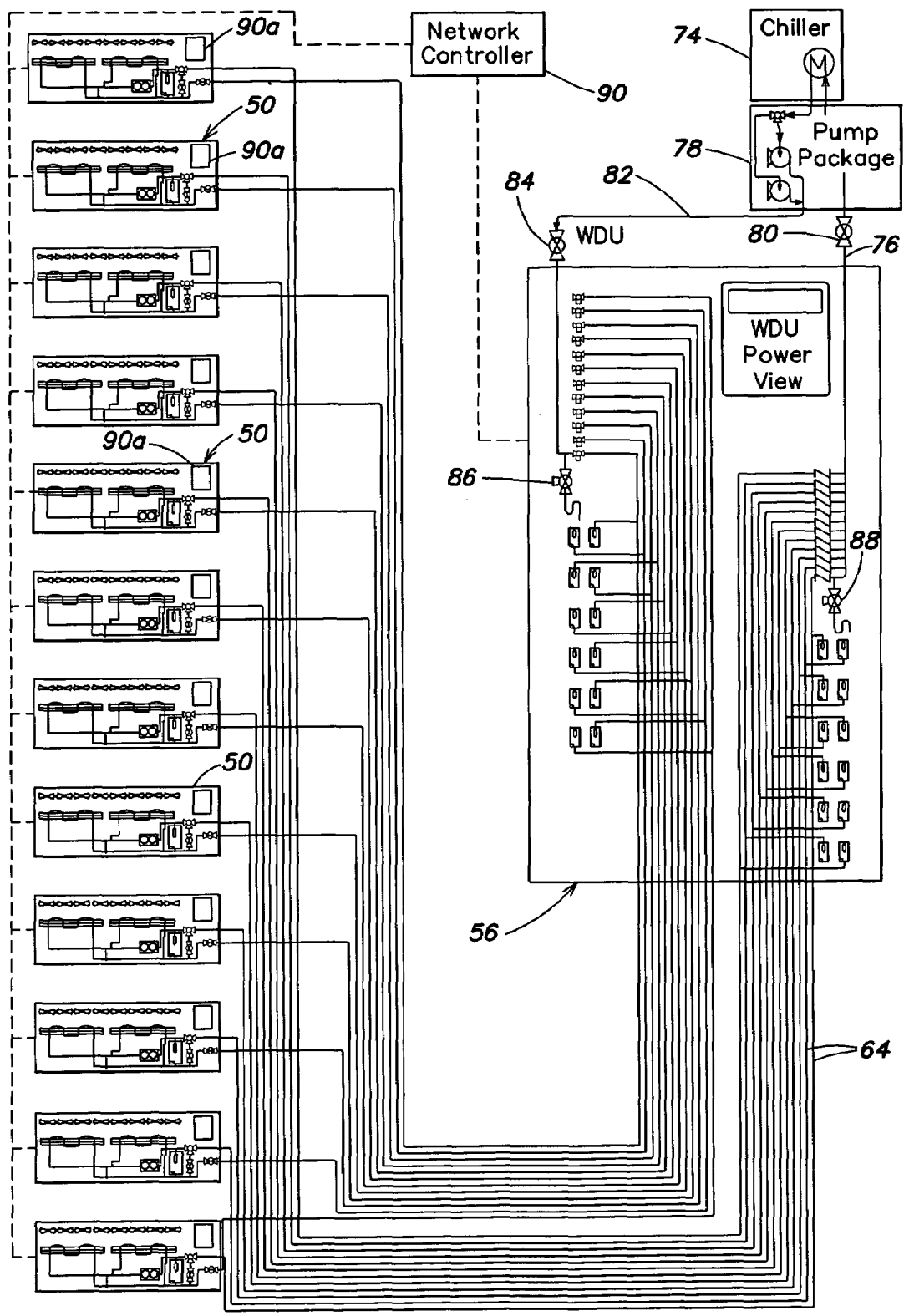
FIG. 2 is a schematic representation of a cooling system of the data center.

As shown in FIG. 2, the distribution box 56 is in fluid communication with a heat exchanger 74, otherwise known as a chiller unit in the art. In one embodiment, the heat exchanger 74 is provided outside the data center 10. Specifically, a line 76 (which corresponds to outlet 54 in FIG. 1) in fluid communication with coolant medium outlet 54 shown in FIG. 1 is provided to deliver heated fluid to a pump 78, which in turn delivers the heated fluid to the heat exchanger 74. A valve 80 is disposed between the line 76 and the pump 78. The heated coolant is cooled in the heat exchanger 74 and cooled coolant is returned to the distribution box 56 via the pump 78 by line 82 (which corresponds to inlet 52 in FIG. 1) through another valve 84. The valves 80, 84 are provided in lines 76, 82 to control the flow of fluid between the distribution box 56 and the heat exchanger 74. In one embodiment, the heat exchanger 74 is adapted to provide chilled water (e.g., approximately 45° F. water) in thermal contact with the coolant provided in the cooling system.

The distribution box 56 may be designed to provide coolant to and receive coolant from any number of cooling racks 50. For example, FIG. 2 illustrates the distribution box 56 distributing coolant to twelve cooling racks 50. As shown, a fluid communication system may be provided to connect each respective inlet and outlet provided in the distribution box 56 to their respective cooling rack 50. The distribution box 56 includes a control valve 86 to control and monitor the flow of cooled coolant to a particular cooling rack 50. Similarly, the distribution box 56 includes another control valve 88 to control and monitor the flow of heated coolant from a cooling rack 50. Specifically, for each cooling rack, control valves 86, 88 are configured to independently control the delivery of chilled coolant to and receipt of warm coolant from the cooling rack. This configuration may employ the implementation of multiple control valves to achieve the functionality described above.

As shown, there are two flexible tubes 64 for each cooling rack, one to deliver chilled coolant to its respective cooling rack and one to exhaust heated coolant from its respective cooling rack. In one embodiment, the fluid communication system of the cooling system comprises flexible tubing 64 which, as discussed above, may be provided at predetermined lengths. The flexible tubing may be of the type fabricated from a suitable polymer, or any other similar flexible material. In one embodiment, the flexible tubing may be purchased from Wirsbo Company of Apple Valley, Minn. under part no. D1251000. In a certain embodiment, the flexible tubing may be approximately one-inch in diameter, and comprise a polyethylene inner layer, an aluminum center layer, and a polyethylene outer layer. In another embodiment, an insulation layer may be provided over the flexible tubing 64. The insulation layer may be fabricated from any suitable material designed to insulate and protect the flexible tubing, such as EPDM foam having a one-half inch thickness. In one embodiment, the flexible tubing may be inserted into the annulus of the insulation layer.

A controller 90 may be employed to control the operation of the cooling system, and specifically, in certain embodiments, the operation of the cooling racks and/or the distribution box 56. With respect to the distribution box 56, the controller may or may not be configured to control its operation. When not communicating with the controller, the distribution box operates under the direction of the cooling racks. In one embodiment, the controller 90 may be a dedicated unit to the cooling system. In another embodiment, the controller 90 may be provided as part of an integrated data center control and monitoring system. In yet another embodiment, each cooling rack 50 may be independently operable by a controller 90a provided in the cooling rack that is in communication with controllers 90a of the other cooling racks. With this particular embodiment (i.e., each cooling rack being configured to be independently operable by controller 90a, each controller unit 90a may embody a Philips XA 16-bit microprocessor. Notwithstanding the particular configuration, the controller is designed to control the independent operation of the cooling racks 50 within the data center 10. Thus, reference herein to "controller" or "controller unit" may be directed to the controller 90 and/or the controller unit 90a.

For example, the controller may be configured to identify the failure or inability of a particular cooling rack located within the data center to cool the air, and to increase the cooling capacity of a cooling rack or cooling racks located near the failed cooling rack. In another embodiment, one cooling rack may operate as the main or master unit and the other cooling racks operate as subservient units that operate under the control of the main unit. In this embodiment, the main cooling rack may be manipulated by the data center operator to control the entire cooling system. For example, the controller may be configured to receive information from the equipment racks so as to determine the amount of power being drawn by each equipment rack. With this knowledge, the controller may be configured to increase the cooling capacity of certain cooling racks within the cooling system based on the energy drawn by the equipment racks.

With continued reference to FIG. 1, and additional reference to FIG. 1C, each cooling rack 50 comprises a housing 92 that may be constructed similarly to the housing 20 of the equipment rack 18. Like the equipment rack 18 and the distribution box 56, the housing 92 is a rectangular structure having a front 94, a back 96, two sides 98, 100, a bottom 102 and a top 104 defined by a frame constructed of vertical and horizontal support members. As will be disclosed in greater detail below, the cooling rack 50 is configured to accommodate cooling equipment and may be conveniently broken down and disassembled for transport or storage with the aid of hand tools only.

As shown in FIG. 1, in one embodiment, the housing 92 of the cooling rack 50 has a width that is approximately one-half the width of the equipment rack 18. As stated above, a typical nineteen inch rack has a width of approximately twenty-four inches. Thus, the width of the housing 92 of the cooling rack 50 is approximately twelve inches. This sizing enables the person configuring the data center 10 to position a cooling rack 50 or multiple cooling racks 50 in between equipment racks 18 while being able to maintain equivalent spacing among several rows. The narrower width also takes up less space, and, coupled with the modular and movable nature of the cooling rack, enables the cooling rack to be conveniently placed between two equipment racks in an easily scaleable manner.

Figure 3:
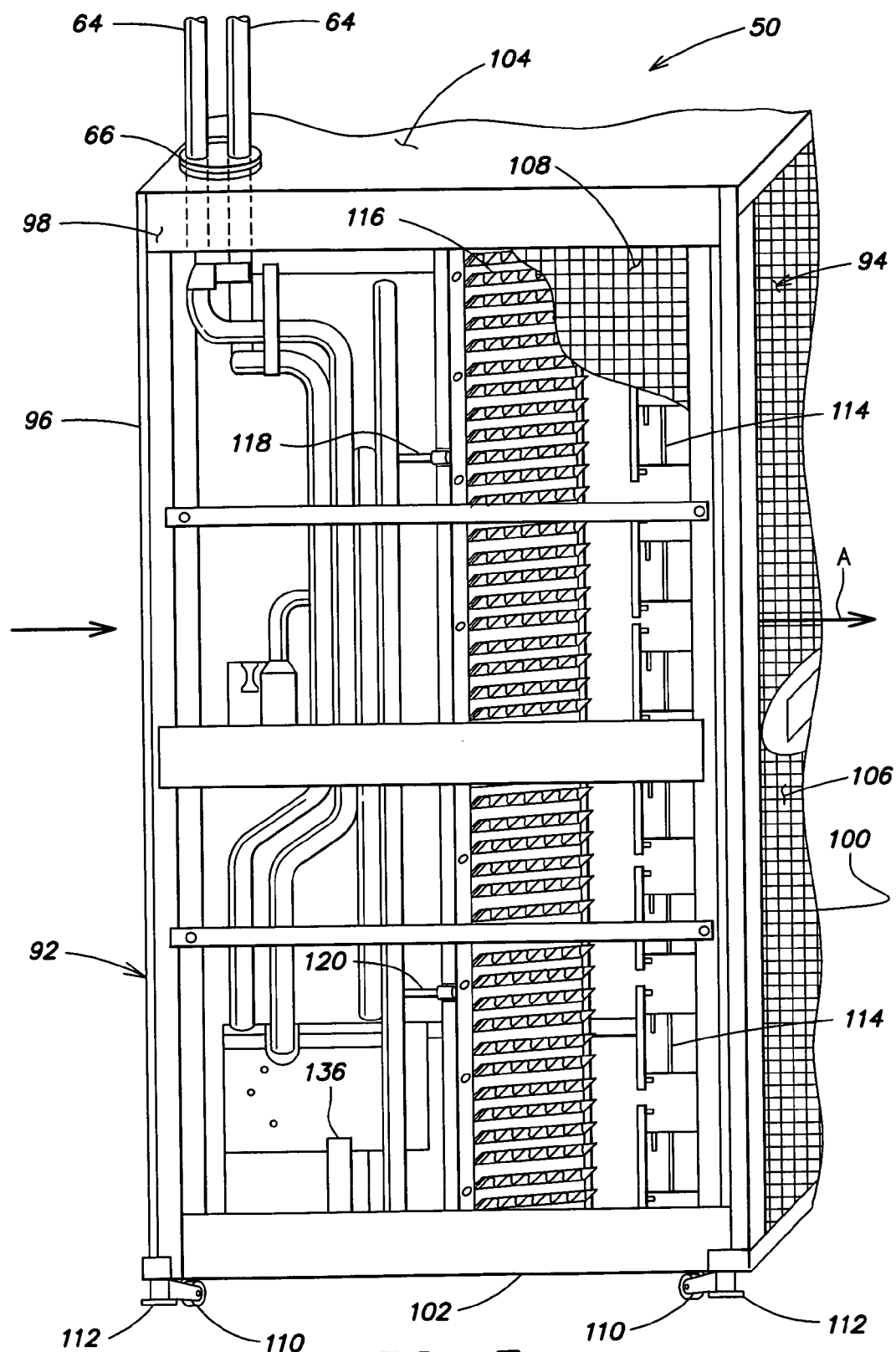
FIG. 3 is a side elevational view of the cooling rack with a significant portion of a side panel removed to show the interior of the cooling rack.

Referring to FIG. 1C, the front 94 of the housing 92 of the cooling rack 50 includes a front panel 106 suitably secured to the frame. The front panel 106 enables an operator of the data center 10 to access the interior region of the cooling rack 50. The cooling rack 50 may include side panels 100 attachable to the frame of the housing 92 to cover the sides 98, 100 of the cooling rack. However, since the cooling rack 50 is typically positioned between two equipment racks 18, the inclusion of side panels 108 is not required. Similarly, the housing 92 may further include a back panel (not shown) to cover the back 96 of the cooling rack 50. In one embodiment, the front, side and back panels may be suitably secured, e.g., by suitable screw fasteners, to the frame of the cooling rack 50. In another embodiment, fasteners capable of manipulation by hand, e.g., thumb screws or quarter-turn fasteners, may be employed to attach the panels to the frame. As shown in FIG. 3, the housing 92 of the cooling rack 50 creates a space within the interior region of the cooling rack to allow components of a cooling system to be housed within the cooling rack. In certain embodiments, the front panel 106 may embody a door hingedly attached to the frame of the housing 92 of the cooling rack 50. The components and configuration of such a cooling system shall be described in greater detail as the description of the cooling system proceeds.

The cooling rack 50 is modular in construction and configured to be rolled into and out of position, e.g., within a row of the data center 10 between two equipment racks 18. Casters 110 are secured to the bottom of the housing 92 of the cooling rack 50 to enable the cooling rack to roll along the floor of the data center 10. Once positioned, leveling feet 112 may be deployed to securely ground the cooling rack 50 in place within the row. As with the equipment rack 18 and the distribution box 56, the casters 110 and leveling feet 112, and their attachment to the housing 92 of the cooling rack, are disclosed in detail in U.S. patent application Ser. No. 10/990,927. In another embodiment, the housing of the cooling rack may be formed with an eye-bolt to enable a crane or some other lifting apparatus to raise and place the cooling rack within the data center.

In one embodiment, the arrangement is such that the fronts 22, 92 of the equipment and cooling racks 18, 50 are adjacent the cold aisle and the backs 24, 96 of the racks are adjacent the hot aisle. The modular and movable nature of the cooling rack 50 makes it particularly effective in cooling locations within the data center 10 requiring climate control, e.g., adjacent a hot aisle. This configuration enables the cooling rack 18 to be used as a building block for data center 10 cooling and climate control, as the data center operator adds and removes cooling racks 50 on an as needed basis. Thus, the cooling rack 50 allows a far superior level of scalability than prior cooling systems and methods. In addition, an operable cooling rack may be quickly and easily provided to replace a failed cooling rack.

As shown, the front of the housing 92 of the cooling rack 50 has a number of variable speed fans (e.g., eight), each indicated at 114, that are adapted to draw filtered air from the back 96 of the cooling rack to the front 94 of the cooling rack 50 as shown by arrow A. In one embodiment, the fans 114 may be assembled and wired within the housing 92 of the cooling rack 50 such that a fan is removed by removing only four screws and sliding the fan out of a receptacle (not shown) formed in the housing 92 of the cooling rack 50. The electrical power provided to each fan 114 may be connected and disconnected by a suitable connector, such as a blindmate connector. The arrangement is such that the fans 114 are "hot swappable" based on their low voltage requirements as well as their easy removal from the receptacle and blindmate connector. In addition, the controller 90 may be configured to monitor the operation of each fan 114 so as to predict the failure of a fan based on power draw variances of the fan.

Further provided within the housing 92 of the cooling rack 50 is a heat exchanger 116. The heat exchanger 116 may include at least one coil having fins, and is positioned at an angle within the cooling rack 50. Specifically, the heat exchanger 116 is positioned generally perpendicularly with respect to the direction of the air flowing through the housing 92 of the cooling rack 50 (parallel to arrow A), with the heat exchanger 116 being positioned at a slight angle with respect to a theoretical vertical plane that is parallel to the front 94 and the back 96 of the housing 92 to enlarge the surface area of the heat exchanger so as to accommodate a greater volume of hot air. The arrangement is such that the hot air that is drawn through the back of the cooling rack 50 and is passed through the heat exchanger 116 to reduce the temperature of the hot air. As mentioned above, the cooling rack 50 may be positioned so that the back of the cooling rack is adjacent a hot aisle. Thus, the air drawn through the back of the cooling rack is relatively hotter than ambient air within the data center 10. The fans 114 blow the cool air from the heat exchanger 116 from the fans to the front 94 of the cooling rack 50. In one embodiment, the cooling rack may provide up to 30 kW of cooling.

Figure 4:
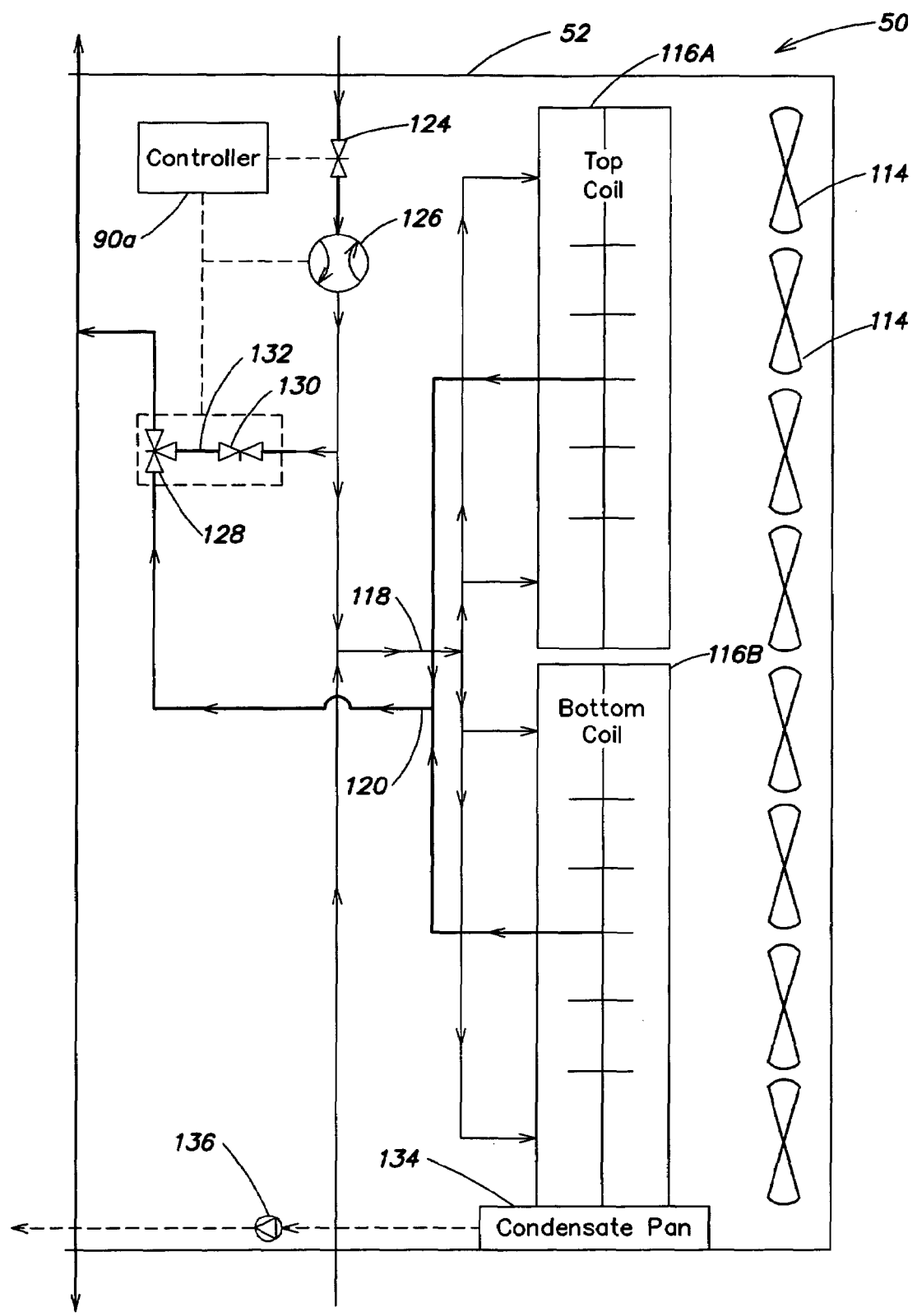
FIG. 4 is a schematic representation of the cooling rack.

As shown in FIGS. 3 and 4, chilled coolant is provided to the heat exchanger 116 by line 118, and heated coolant is exhausted from the heat exchanger by line 120. As shown, the lines 118, 120 are connected to flexible tubing 64 by coupling 66 located near the top of the housing 92. The flexible tubing 64 is connected by coupling 66 in the manner described above to the distribution box 56. Chilled coolant entering the cooling rack 50 flows through a two-way valve 124 and a flow meter 126, which are provided to control the delivery of chilled coolant into the cooling rack 50. The two-way valve 124 and the flow meter 126 sometimes may be together referred to as a control valve herein. In one embodiment, depending on the configuration of the controller and the network manager system, the flow meter 126 is operably coupled to the controller 90a to measure the flow of coolant through the flexible tubing 64. The cooling rack of embodiments of the present invention utilizes the flow meter 126 in order to provide the flow rate of the coolant to the controller 90a.

In one embodiment, the flow meter 126 enables the controller 90a to calculate the capacity of the operation of the cooling rack 50 based on information obtained by the controller. Once through the flow meter 126, chilled coolant flows to a top coil 116A and a bottom coil 116B of the heat exchanger 116. Chilled coolant is heated by the hot air drawn through the heat exchanger 116 by the fans 114. The calculation of capacity of the cooling rack will be discussed with reference to FIG. 5 as the description of the system proceeds.

Once heated, coolant is delivered from the heat exchanger 116 to a return feed via line 120 to a three-way mixing valve 128. As best shown in FIG. 4, a portion of chilled coolant may be diverted from line 118 to the three-way mixing valve 128 by a two-way, quarter turn, by-pass, shut off ball valve 130. As shown, the shut off ball valve 130 may be attached to a by-pass leg 132 of the three-way mixing valve 128, so that by shutting off the shut off ball valve 130, the effect is to provide two-way control to the three-way valve for applications where two-way control is desired. In one embodiment, chilled coolant entering the cooling rack 50 is at approximately 45° F. Heated coolant exiting the cooling rack 50 is at approximately 55° F.

By making the three-way valve convertible to a two-way valve, this configuration allows for a cooling rack 50 to be placed any distance from the distribution box 56 without risk of issues related to load balance problems. For example, if a first cooling rack is located approximately ten feet away from the distribution box and a second cooling rack is located approximately one hundred and twenty feet away from the distribution box, the first cooling rack would receive the majority of coolant being distributed by the distribution box since there less pressure drop in coolant delivered to the first cooling rack than in coolant delivered to the second cooling rack. When the three-way valve is in three-way mode, the first cooling rack will send the coolant it needs through the main circuit and the remainder of coolant will flow through the bypass circuit. The second cooling rack may only get approximately 80% of the required coolant, while the first cooling rack is bypassing the bulk of the coolant. By converting the three-way valve to two-way mode, the first cooling rack will only draw coolant that it requires, thereby ensuring the remainder of the coolant flows to the second unit, or other remote units.

As shown, a condensate pan 134 may be provided at the bottom of the cooling rack 50 to capture condensation from the top and bottom coils 116A, 116B of the heat exchanger 116. A pump 136 may be provided to pump condensation from the pan 134. Although not shown, the cooling rack 50 uses a pair of float switches in the condensate pan 134 to establish a condensate production rate. Given that the volume change is constant from the activation of a lower switch to an upper switch, and using the time variable between these two events a condensate production rate may be established. The cooling capacity is rated based on two factors: (1) the temperature change in the air (sensible capacity), and (2) the humidity change in the air (latent capacity). Condensate is a measure of how much water vapor is removed from the air, therefore, by knowing the condensate production rate, the latent capacity of the unit may be established. Additionally, the float switches may facilitate the control of the pump 136, the upper level switch initiating condensate pump operation and the lower level switch terminating condensate pump operation. In one embodiment, with the exception of the condensate pump 136, the entire cooling rack 50 utilizes direct current components.

Although the housing of the cooling rack is illustrated in the drawings as being one-half the width of an equipment rack, the cooling rack may be sized to any desired configuration. The provision of a cooling rack having one-half the industry-standard width improves the scalability of the cooling rack. However, it is contemplated, for example, to configure the housing to have the same width as the housing of the equipment rack. In such an embodiment, the cooling rack may be configured with cooling system components that enhances the cooling capacity of the cooling rack. This configuration may be desirable for hot spots within the data center.

Figure 5:
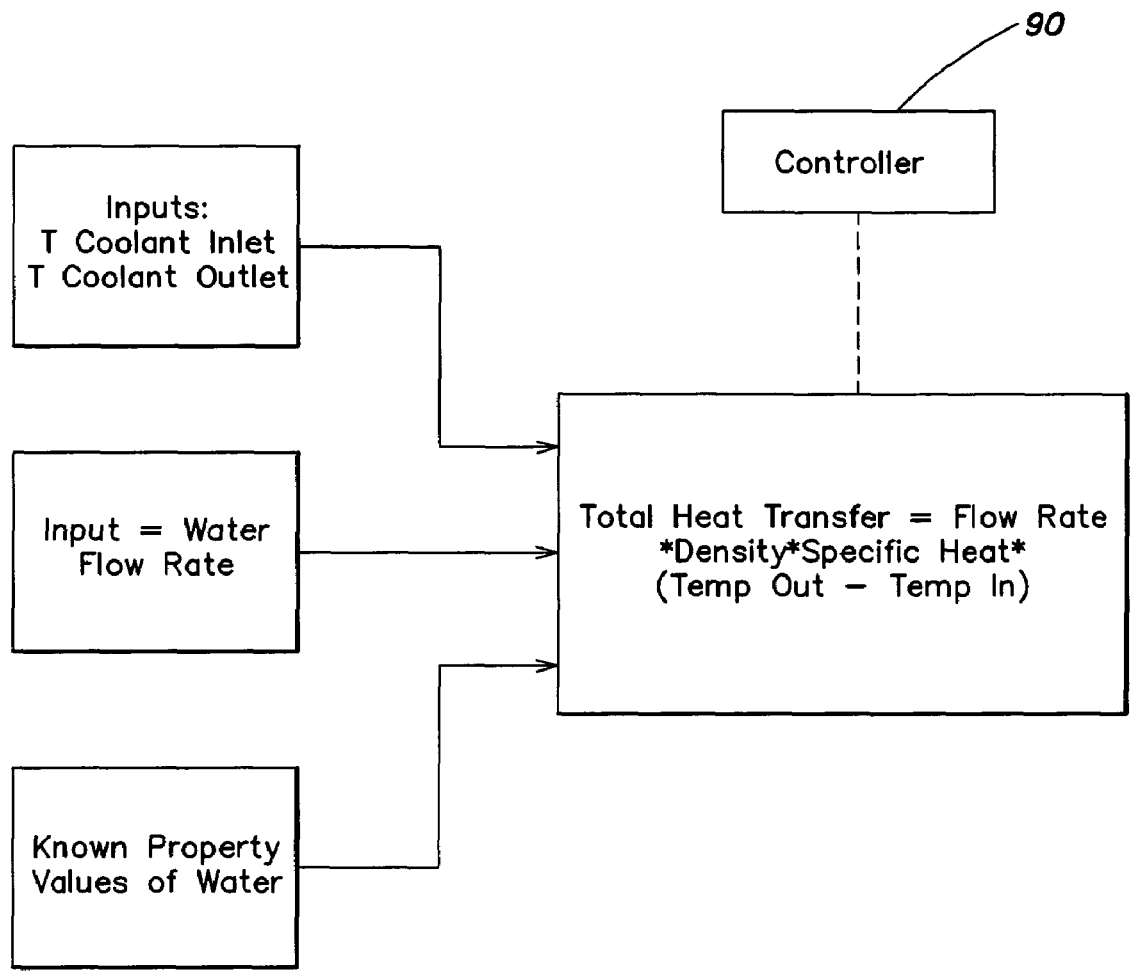
FIG. 5 is a flow diagram of environmental parameters that are monitored by the cooling system to determine cooling capacity.

Turning now to FIG. 5, the controller 90 (including controller units 90a) is adapted to control the operation of the cooling system based on environmental parameters obtained by the controller. In one embodiment, the controller 90 may embody only controller units 90a provided in the cooling racks 50 that communicate with one another over a controller area network (CAN) Bus. In other embodiments, a master controller may be provided to control the operation of the controller units 90a. As shown in FIG. 1, each cooling rack 50 is provided with a display assembly 138 operably coupled to the controller 90a. The display assembly 138 is adapted to display the environmental conditions of the data room, such as, and not limited to, the temperature and the humidity of the data center at the cooling rack, the temperature of the air entering into and exiting out of the cooling rack, the temperature of coolant entering into and exiting out of the cooling rack, the flow rate of coolant entering into the cooling rack, and the cooling capacity of the cooling rack. Suitable monitors and/or gauges may be provided to acquire such information. Alternatively, or in addition to the foregoing embodiment, the environmental conditions may be displayed on a unit provided with an integrated data center control and monitoring system.

As shown in FIG. 5, changes to the environmental conditions, such as the temperature of the data center 10, results in changes of inputs including the temperature of the coolant flowing into and out of each cooling rack 50. Further inputs provided to the controller 90a (and/or controller 90) include the flow rate of coolant entering into the cooling rack 50 through the flow meter 126, as well as the known values of the coolant (e.g., water). Based on the temperature of the coolant, the flow rate of the coolant, the total heat transfer may be determined, which is calculated by multiplying the flow rate by the coolant density, by the specific heat of the coolant, and by the difference between the coolant outlet and inlet temperatures. This heat transfer calculation is determined by the controller 90a so that the amount of coolant delivered to a cooling rack 50 through the flow meter 126 of the cooling rack may be calculated. The controller 90a may be further configured to allow for user input for calculating load capacity of each cooling rack 50 in real time. The value obtained may be compared to the maximum possible cooling capacity to assess the reserve cooling capacity of the cooling system.

For example, the total gross cooling capacity of a cooling rack 50 may be determined by the following equation:

$$\text{total gross cooling capacity} = \text{constant} \times \text{flow rate} \times (T_{out} - T_{in}) \quad (1)$$

With equation 1, the flow rate is identified in gallons per minute (GPM) and the constant is 501. Based on this result, the total net cooling capacity in BTU per hour may be determined by the following equation:

$$\text{Total net cooling capacity} = \text{total gross cooling capacity} - \text{fan heat} \quad (2)$$

Equation 2 may also be arrived at by adding the sensible cooling capacity and the latent cooling capacity.

Figure 6:
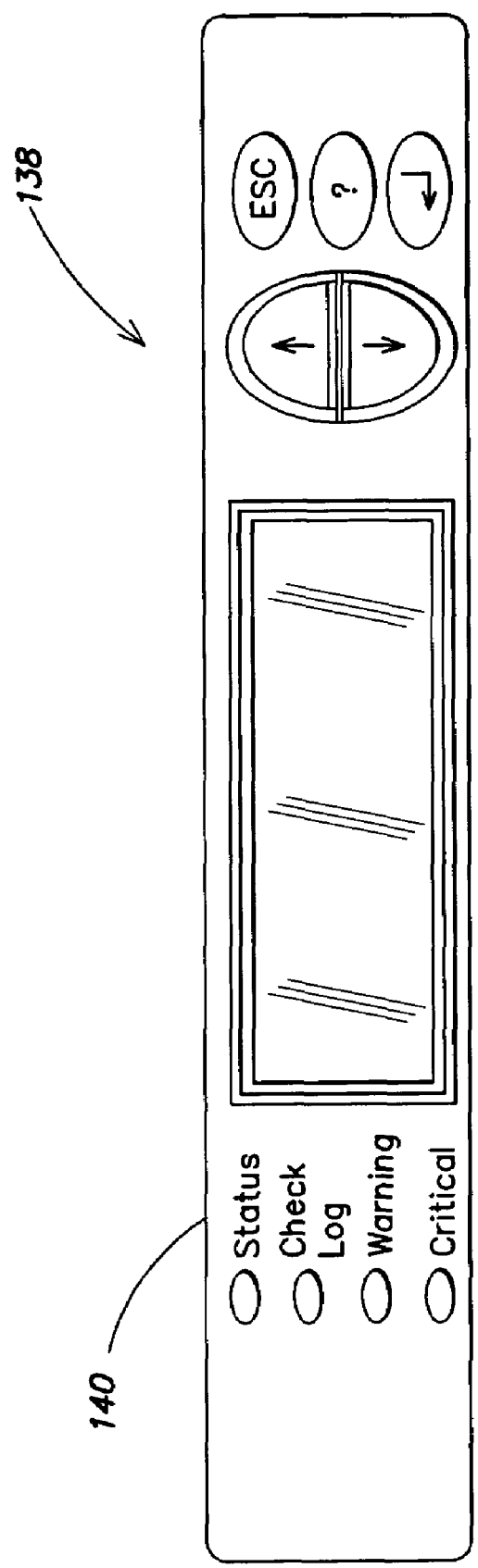
FIG. 6 is a front view of a display unit of the cooling rack.
Figure 7:
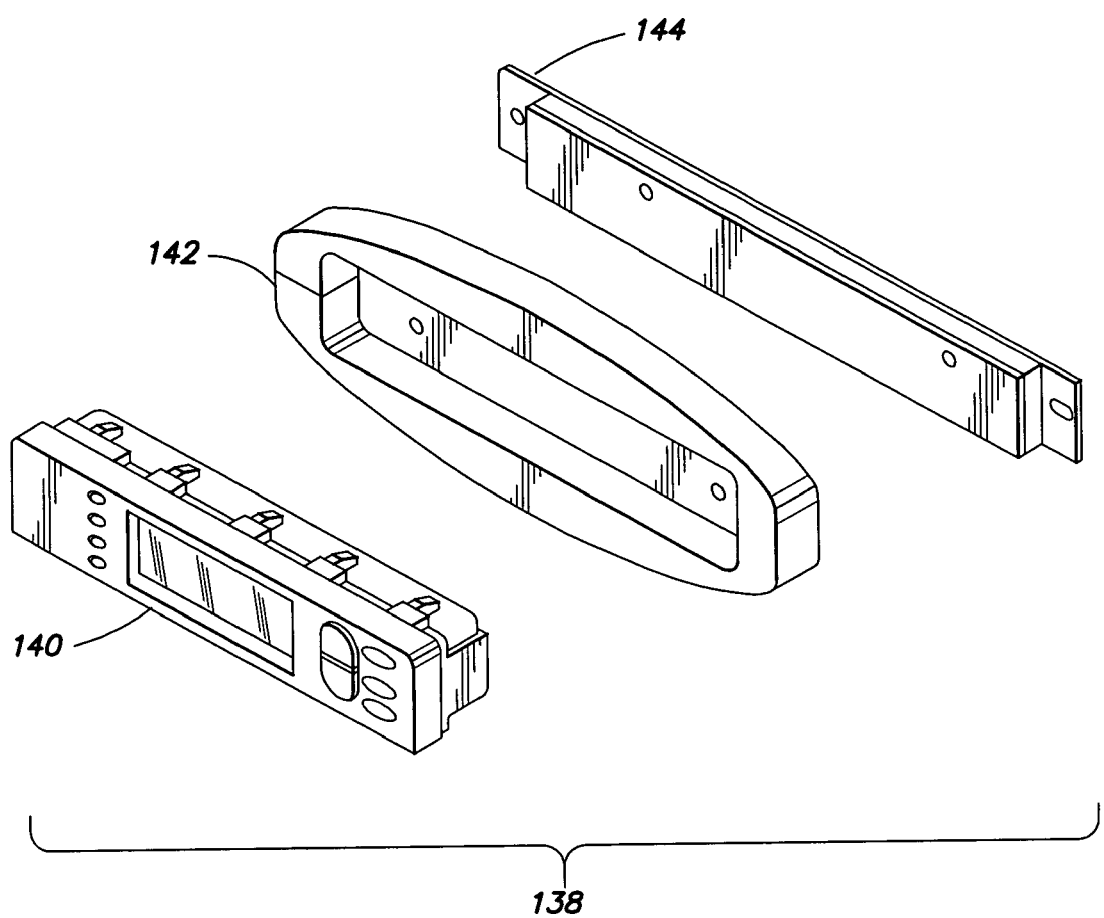
FIG. 7 is an exploded perspective view of a display assembly incorporating the display unit shown in FIG. 6.

As shown in FIGS. 6 and 7, the display assembly 138 includes a display unit 140 having a liquid crystal display, for example, to display the environmental conditions, such as temperature and humidity of the data center, the temperature of air entering into and exiting out of each cooling rack, the temperature of coolant entering into and exiting out of each cooling rack, and the flow rate of coolant entering such cooling rack. A plurality of control buttons and status indicators are further provided on the display unit 140 to enable the operator to manipulate the operation of the cooling system. As shown in FIG. 7, the display assembly 138 may be secured within an opening formed in the front panel 106 of the cooling rack by means of a sealing gasket 142 and a mounting bracket 144 in which screw fasteners (not shown) may be provided to secure the display assembly 138 to the front panel 106 within the opening.

Figure 8:
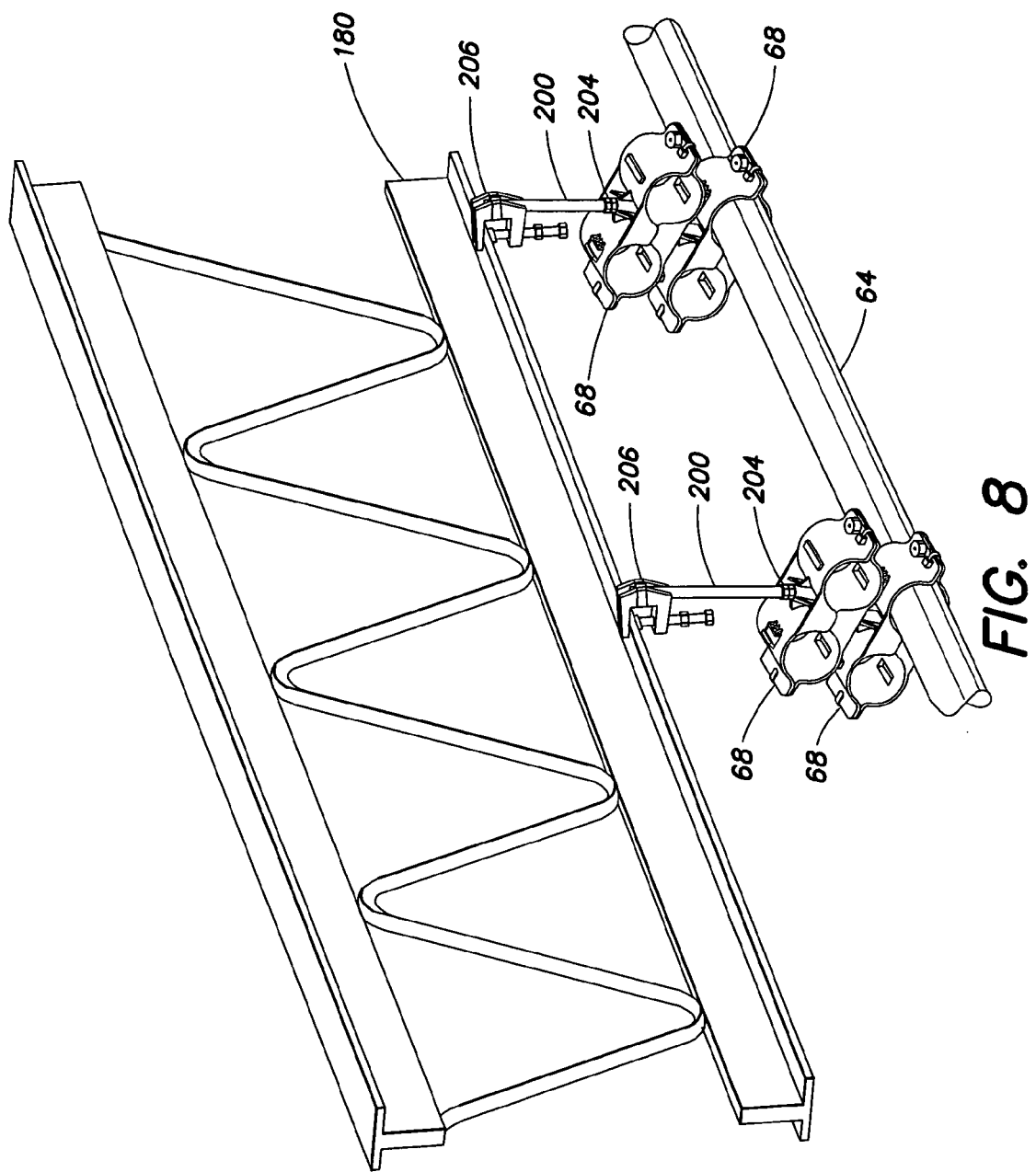
FIG. 8 is a perspective view of two support members of an embodiment of the invention, the support member being secured to a structural member of the data center and supporting flexible tubing.

Turning now to FIG. 8, as discussed above, numerous support members, each generally indicated at 68, may be provided to secure the flexible tubing 64 from the ceiling. In certain embodiments, the flexible tubing 64 leaves the distribution box 56 and is directed to the ceiling 16 of the data center. Once at the ceiling 16, the flexible tubing 64 turns in a generally horizontal direction along the ceiling towards its respective cooling rack 50. Once above the cooling rack 50, the flexible tubing 64 drops toward the cooling rack 50 in which the flexible tubing 64 is suspended between the cooling rack 50 and the ceiling. The support members 68 and the clamps 70, 72 of the present invention are designed to support and guide the flexible tubing 64 and to direct the bends of the tubing. As best shown in FIG. 8, the support members are designed to suspend the flexible tubing 64. Support members 68 may be further utilized to secure the flexible tubing 64 during relatively long, straight sections of flexible tubing. In one embodiment, the support members 68 and the clamps 70, 72 may be molded from polymeric material and are formed in two parts to clamp around the flexible tubing 64 (including the insulation layer, when provided). In other embodiments, the support members 68 and the clamps 70, 72 may be fabricated from any suitable metal or alloy.

FIG. 8 illustrates the support member 68 that is primarily employed to hang or suspend the flexible tubing 64 from the ceiling or another support structure, such as an I-beam 180 or some other structure, toward its respective cooling rack 50. As shown, the support member 68 is designed to hold both flexible tubes 64 provided to a cooling rack 50 next to one another so that the flexible tubes 64 are aligned with the coupling 66 provided to connect the flexible tubing 64 to the cooling rack 50. One benefit of the configuration of the support member 68, and the clamps 70, 72, is that they may be assembled without the need of tools.

Figure 9:
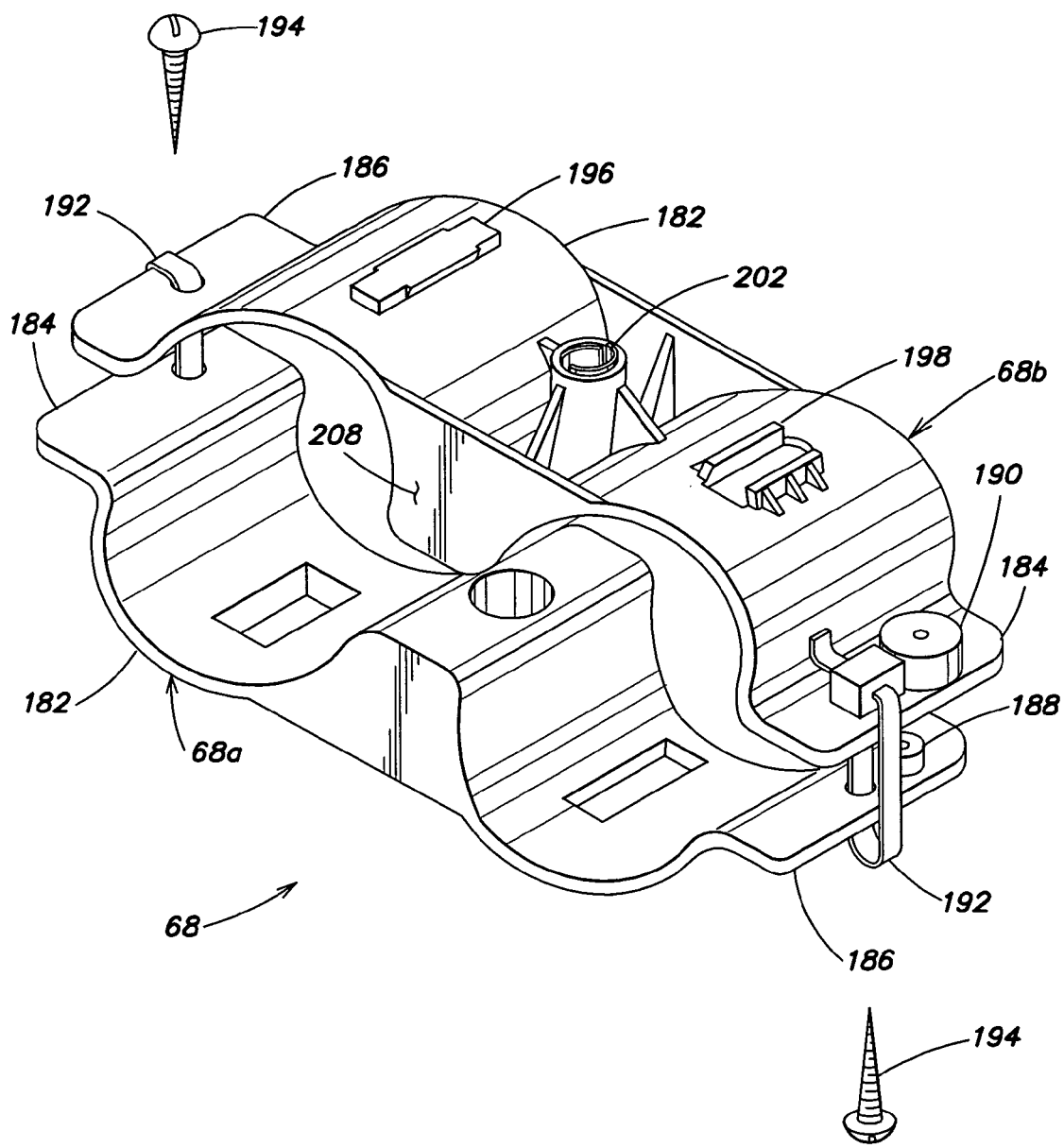
FIG. 9 is a perspective view of one of the support members shown in FIG. 8.

Referring to FIG. 9, the support member 68 includes two parts 68a, 68b configured to hold both flexible tubes 64 (FIG. 8) in side-by-side relation. Each part 68a, 68b includes a wall portion 182 that is formed to fit over two lines of flexible tubing 64 (and the insulation layer when provided) that are positioned in side-by-side relation. Flanges 184, 186 are provided at opposite ends of the wall portion 182. As shown, flange 186 includes a boss 188 that is received in a receptacle 190 formed in the other flange. The arrangement is such that when clamping the parts of the support member over the flexible tubing, the bosses 188 are received in the receptacles 190 to maintain the support member 68 in a clamped position over the flexible tubing 64. The walls 182 of the parts 68a, 68b are sized so that the flexible tubing fits comfortably within the parts, thereby preventing the crimping or deformation of the flexible tubing and/or the insulation layer when provided. Once positioned over the flexible tubing 64, in one embodiment, zip ties 192 may be employed to secure the parts over the flexible tubing. In other embodiments, screw fasteners 194 may be used in the manner shown in FIG. 9.

Figure 10:
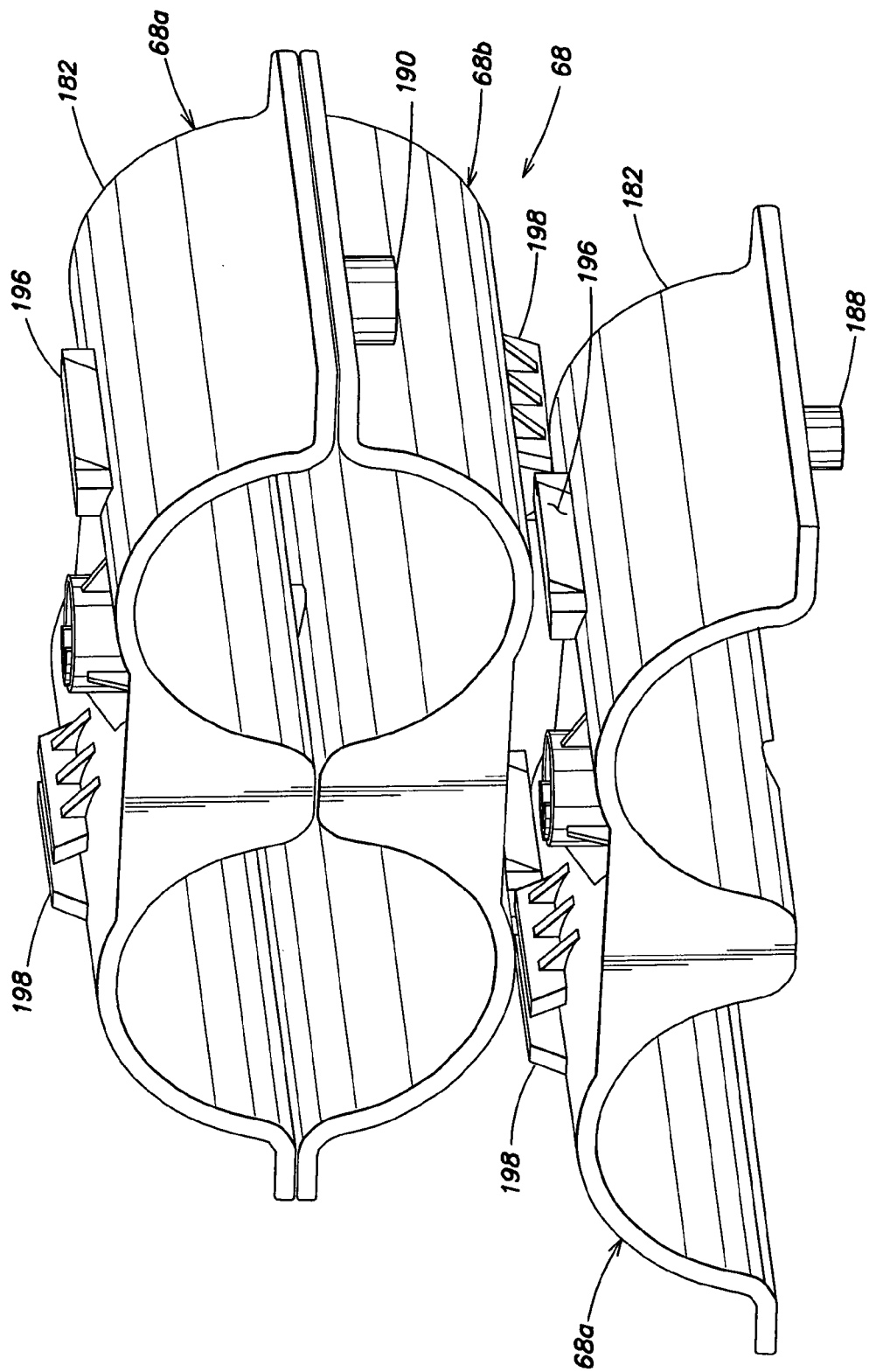
FIG. 10 is a perspective view of a support member being releasably secured to another support member.
Figure 11:
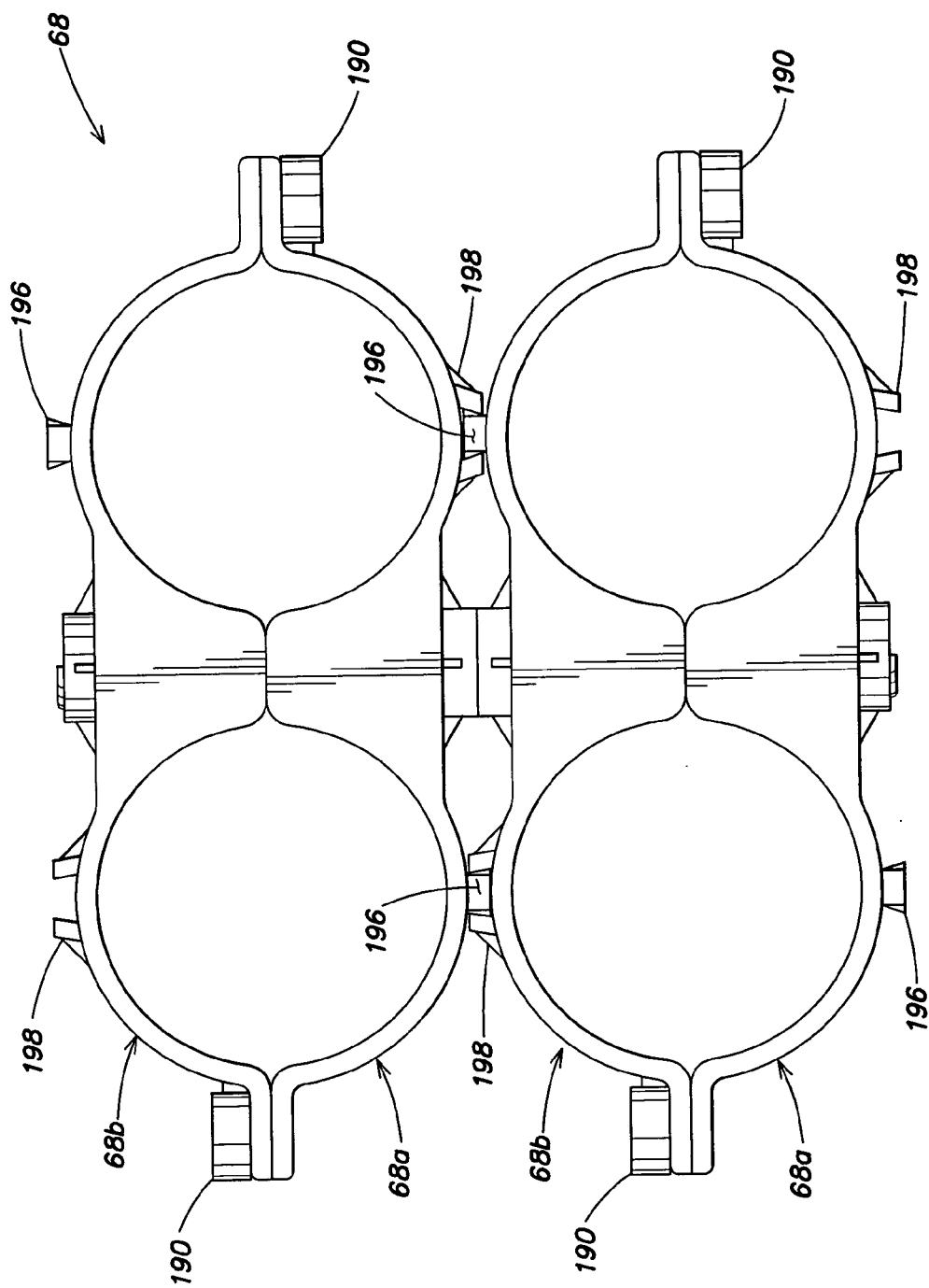
FIG. 11 is a front elevational view of the support members shown in FIG. 10, with the support members being releasably secured to one another.

As shown in FIGS. 10 and 11, the support members 68 may be arranged in stacked relationship to secure more than two flexible tubes (not shown) to one another. The arrangement is such that the parts 68a, 68b of each support member 68 are formed with interconnects 196, 198 that are adapted to be releasably secured to another support member. Each of the parts 68a, 68b has both interconnects 196, 198 provided on the wall 182 of the part in the manner shown in FIG. 9. The arrangement is such that the interconnect 196 of one part 68b is releasably inserted into its mating interconnect 198 of the other part 68a to attach a support member 68 to another support member 68. In one embodiment, the interconnects 196, 198 may be configured as one of a dovetail attachment and a dovetail receptacle. Each support member 68 may be further configured to be secured to a support rod 200, which is suitably secured to a support structure, such as the I-beam 180. The support rod 200 also prevents the support members 68 from sliding with respect to one another when configured in the stacked arrangement discussed above and shown in the drawings.

Referring back to FIG. 8, the support members 68 are supported by the support rods 200 to run flexible tubing 64 to their respective cooling racks. The support members 68 are configured with a central opening 202 (FIG. 9) sized to receive the threaded rod 200 therethrough. A pair of nut fasteners, each indicated at 204, is provided at the bottom of the threaded rod 200 to support the support members 68. Although FIG. 8 illustrates each support rod 200 having two support members 68, it should be understood that the support rods may secure more or less support members depending on data center requirements and/or the load constraints on each support rod. As shown, each support rod has, at its upper end, a clamping mechanism 206 that is configured to be secured to the I-beam 180, or some other structure. The clamping mechanism 202 is configured to clamp onto a flange of the I-beam 200.

Figure 12:
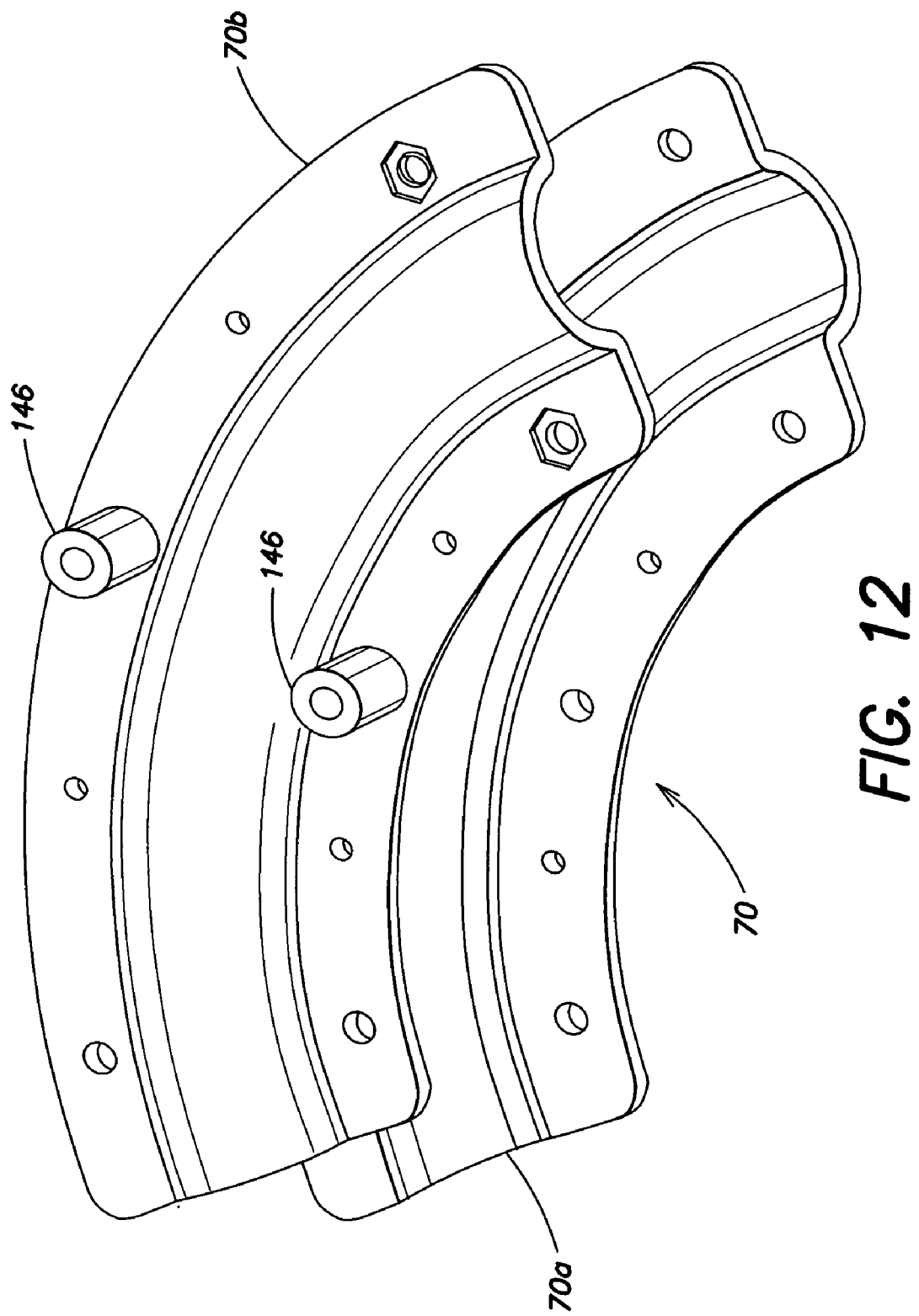
FIG. 12 is a perspective view of a clamp of an embodiment of the present invention.
Figure 13:
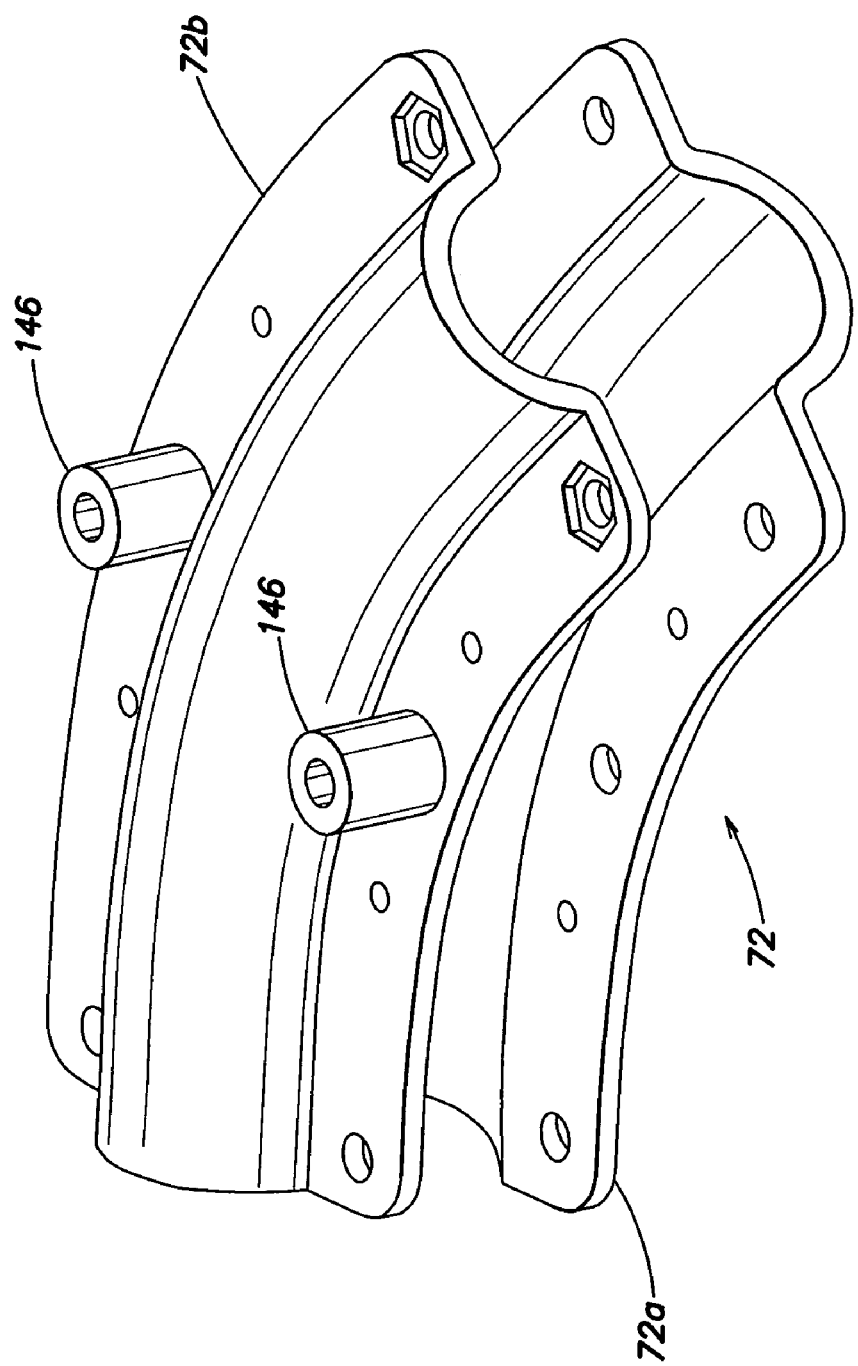
FIG. 13 is a perspective view of another clamp of an embodiment of the present invention.

FIGS. 12 and 13 illustrate clamps 70, 72, respectively, used to secure the flexible tubing 64 within the data center. FIG. 12 illustrates the 90° clamp 70 referenced above. As with clamps 68, the clamp 70 includes two parts 70A, 70B designed to mate with one another to secure the flexible tubing 64 between the two parts. Multiple openings (not designated) are provided to receive zip ties or screw fasteners (not shown) to secure the clamp 70 to the wall 14, for example. A pair of thumb turn fasteners 146 may further be provided to secure the two parts 70A, 70B to one another prior to attaching the clamp 70 to the wall 14, or other suitable structure. The clamp 70 is used when turning the flexible tubing 64 in directions that are approximately 90°. Similarly, clamp 72 (see FIG. 13) may be provided when turning the flexible tubing 64 in directions that are approximately 45°. As shown in FIG. 13, the clamp 72 is also formed in two parts 72A, 72B. Other than the angle the clamp turns the flexible tubing 64, the 45° clamp 72 is identical in construction to the 90° clamp. Of course, the clamp may be designed to turn the flexible tubing 64 any amount of turn radius, such as 15° and 30°.

The flexible tubing 64, support member 68 and clamps 70, 72 may be used in combination with a cable trough (not shown) provided between adjacent equipment racks 18 and cooling racks 50. Specifically, the cable trough bridge is a formed metal component that requires no physical attachment to a cooling rack 50. In one embodiment, the flexible tubing may be disposed within the cable trough and the clamps may be adapted to secure the flexible tubing to the cable trough. In addition, power and telecommunications may be disposed in the cable trough as well. The arrangement is such that the cable trough acts as a bridge over the cooling rack 50 and connects to the adjoining two equipment racks, allowing the cooling rack 50 to be slid in or out of the row and moved to another location of the data center 10.

Referring back to FIGS. 1 and 2, in operation, filtered warm air is drawn into each cooling rack 50. At this point, the air temperature is measured. Next, the warm air flows across the heat exchanger 116, which absorbs heat from the air, thereby cooling off the air. At this point, the temperature is sampled again. The fans 114 pump the cooled air through the front 94 of the cooling rack 50. The fans 114 may be individually controlled to manipulate the air flow through the cooling rack. The pressure difference is measured across the cooling rack 50 in order to prevent pressurization of a rear plenum, when employing front and rear plenums, which will be discussed below. Simultaneously, coolant (e.g., water) enters each cooling rack 50 and the temperature of the coolant is measured. The coolant enters the two-way valve 124, which throttles and in some cases, is redirected to the shut off ball valve 130. Coolant that is not diverted flows through the heat exchanger 116 where it absorbs heat from the warm air flowing through the heat exchanger. Coolant next enters the three-way valve 128 and may travel through another flow meter (not shown) to measure the flow of coolant exiting the cooling rack 50. At this point, the temperature of the coolant is taken. The air, coolant, and flow rate data are used to calculate the performance and the capacity of the cooling rack 50.

Figure 14:
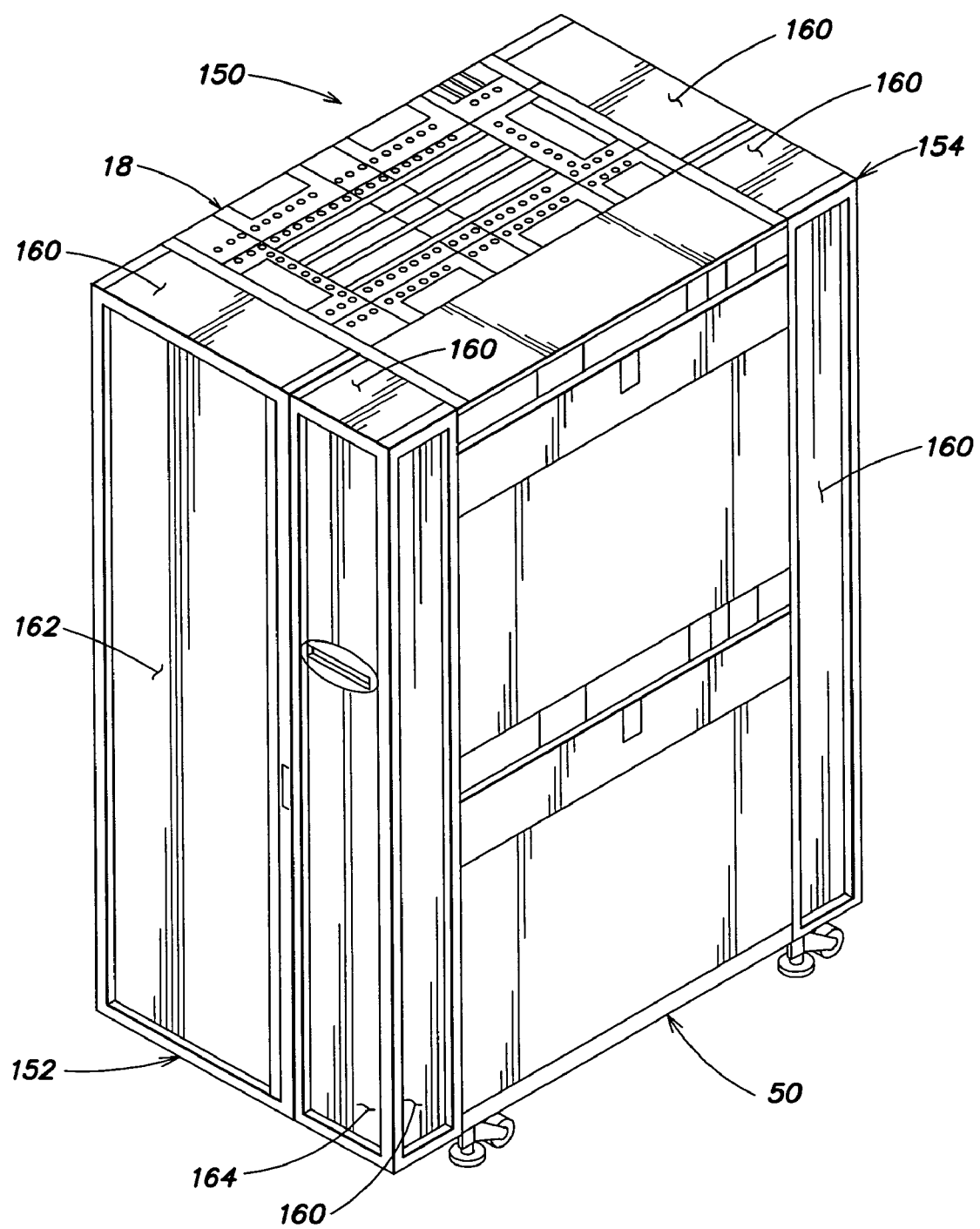
FIG. 14 is a perspective view of a cooling system of another embodiment of the invention.
Figure 15:
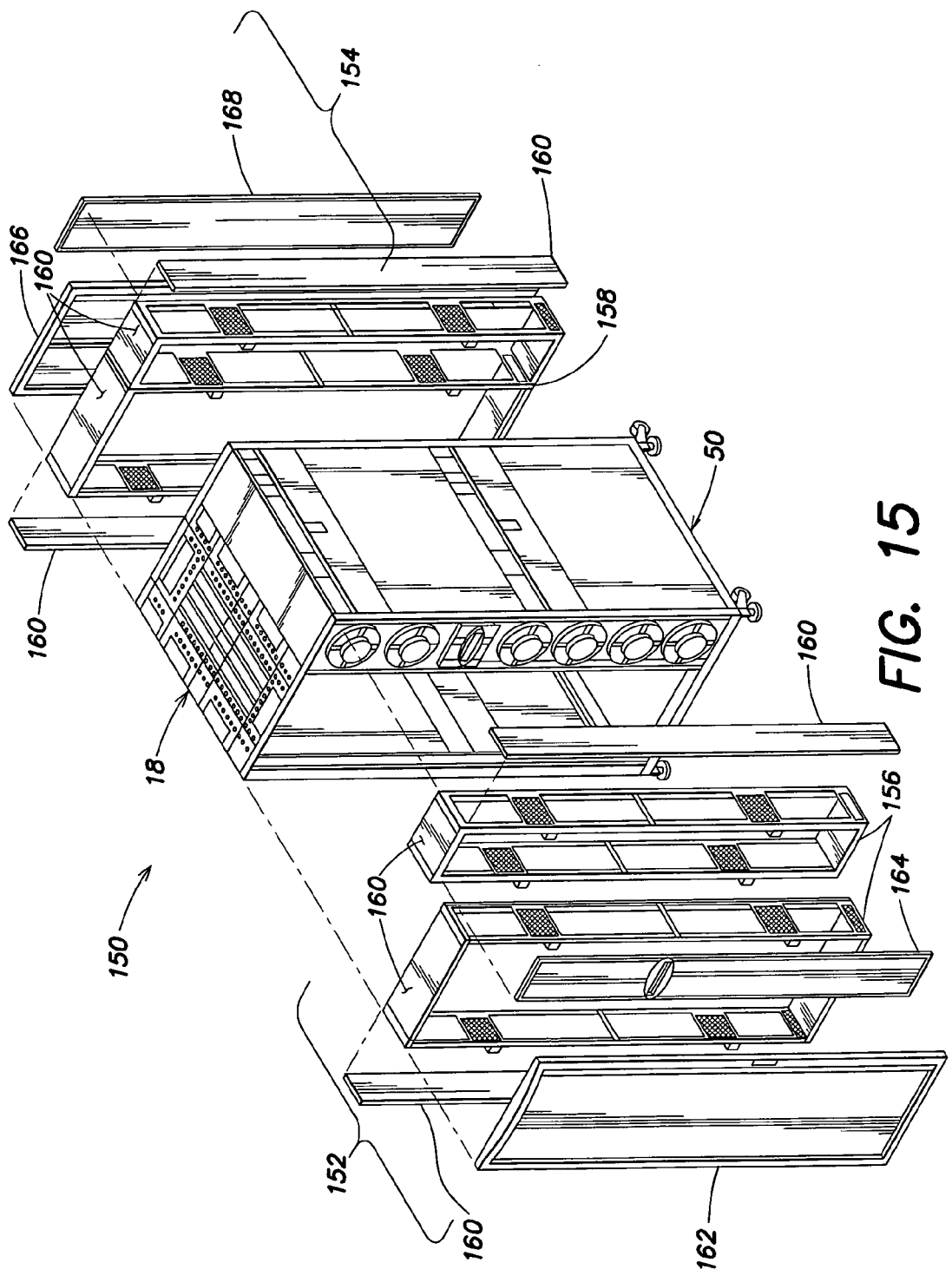
FIG. 15 is an exploded perspective view of the cooling system shown in FIG. 10.

Turning now to FIGS. 14 and 15, there is generally indicated at 150 a cooling system of another embodiment of the invention. As described above, each equipment rack 18 is capable of generating a tremendous amount of heat. Sometimes, it is desirable to provide a cooling rack 50 that is dedicated to cooling a particular equipment rack 18. The cooling system 150 is designed to cool a single cooling rack in the manner described below.

The cooling system 150 includes front and back plenums, each generally designated at 152, 154, respectively. As shown, the plenums 152, 154 are adapted to be attached to the fronts 22, 94 and the backs 24, 96 of the equipment and cooling racks 18, 50, respectively. The arrangement is such that the equipment rack 18 and the cooling rack 50 are arranged in side-by-side relation after removing the front and back doors of the equipment rack and the front and back panels (or doors) of the cooling rack. Each plenum 152, 154 includes a frame 156, 158, respectively, and a plurality of clear inserts, each indicated at 160. Each insert 160 is sized to fit within a respective opening of the frame 156 or 158. The front plenum 152 includes front doors 162, 164 for the equipment and cooling racks 18, 50, the front doors being nearly identical in construction to the front door 34 of the equipment rack 18 and the front panel 106 of the cooling rack 18. Similarly, the back plenum 154 includes back doors or panels 166, 168.

The arrangement is such that the plenums 152, 154 capture air within the equipment rack 18 and the cooling rack 50 to create an isolated environment between the equipment rack and the cooling rack so that heated air flows directly from the back of the equipment rack to the back of the cooling rack through the back plenum 154. The heated air is then drawn by the fans 114 of the cooling rack 50 over the heat exchanger 116 to cool the air to a desired temperature. The fans 114 then direct the cooled air to the front plenum 152 to the front 22 of the equipment rack 18. This cooled air is then drawn through the electronic equipment housed within the equipment rack 18 to cool the electronic equipment. As shown in FIG. 15, the frames 156, 158 of the plenums 152, 154 extend between the equipment and cooling racks 18, 50 so that inserts 160 may be selectively placed within openings provided by the frames. In addition, the inserts 160 provided on the outside of the plenums 152, 154 may be selectively removed to introduce air from the data center 10 within the equipment rack 18 and/or the cooling rack 50. Further, inserts or other air flow devices may be included in the front and rear doors of the frames of the plenums.

Thus, plenums 152, 154 provide a modular system designed to work in conjunction with an equipment rack (such as rack 18) and a cooling rack (such as cooling rack 50) to provide maximum cooling predictability, capacity and efficiency. By adding the back plenum 154, air exhausted by the electronic equipment is forced to pass through the cooling rack. This configuration ensures that warm air exhausted by the equipment rack is cooled prior to being directed toward the front of the equipment rack. Also, by adding the front plenum 152, air is further contained, and noise generated by the equipment and cooling racks is dampened. Additionally, air flow within the equipment rack and the cooling rack, when employing the front and back plenums, can be balanced so as to prevent pressurization or depressurization of either the plenum or the equipment rack or the cooling rack.

The cooling system of embodiments of the present invention is modular and scaleable so that a person designing a cooling system for the data center 10 may select individual components. Specifically, depending on the electronic equipment deployed within the data center 10, and the optimum operating conditions required for the equipment, the person may design a cooling system that is optimized and tailored to the particular data center. The person selects components for the cooling system, including, but not limited to: one or more distribution boxes 56 adapted to distribute coolant; one or more cooling racks 50; flexible tubing 64 to connect the distribution box (or boxes) to the cooling racks; a plurality of support members 68 and clamps 70, 72 to support and otherwise secure the flexible tubing; a controller 90 (including controller units 90a provided with each cooling rack 50) to control the flow of coolant from the distribution box to the cooling racks; and a control valve (e.g., two-way valve 124 and flow meter 126) to control the flow of coolant. When selecting the components, the lengths of the flexible tubing, the tubing diameters, which may vary from the one-inch diameter referred to above, and the number and types of clamps may be computed. In a preferred embodiment, the location of the cooling racks 50 and the distribution box 56 in the room may be determined using a computer aided design tool. Reference is made to U.S. patent application Ser. No. 11/120,137, entitled "METHODS AND SYSTEMS FOR MANAGING FACILITY POWER AND COOLING," filed on Apr. 7, 2005 and U.S. Provisional Patent Application No. 60/719,356, entitled "METHODS AND SYSTEMS FOR MANAGING FACILITY POWER AND COOLING," filed on Sep. 22, 2005, which are assigned to the assignee of the present application and incorporated herein by reference. These applications generally disclose systems and methods for designing data centers and for managing equipment contained within the data center.

Once the cooling system for the data center 10 is designed, and the components of the cooling system are selected, the cooling system components may be packaged and shipped to the data center from a manufacturing or distribution facility. Once received, the cooling system components may be assembled and otherwise installed within the data center 10. Specifically, the distribution box 56 is connected to a cooling source, such as a chiller 74. The cooling racks 50 are selectively positioned within the data center 10 between equipment racks 18 or in any other suitable location. Flexible tubing 64 is provided to connect the distribution box 56 to the cooling racks 50, with the aid of couplings 66, support members 68 and clamps 70, 72. The cooling racks 50 and the distribution box 56 are suitably connected to a power source (not shown) and the controller 90 to complete the installation.

The cooling racks may be of the type discussed above. As discussed, the flexible tubing 64 may be pre-cut prior to shipping, or may be cut to length at this point. Alternatively, the flexible tubing 64 may be pre-cut to an approximate length with some additional length provided in the flexible tubing for variations that occur unexpectedly. Once the distribution box 56 and cooling racks 50 are in place, the installer may suspend the flexible tubing 64 overhead with the support members 68. At this point, the terminal ends of the flexible tubes 64 are connected by suitable couplings 66. The distribution box 56 and the cooling racks 50 are further coupled with a suitable electrical supply and to the controller 90 and/or controller units 90a.

As referenced above, in one embodiment, the controller 90 may be a separately dedicated unit that controls the operation of the distribution box 56 and the cooling racks 50. In another embodiment, the controller 90 may be provided in one of the cooling racks in place of one of the controller units 90a, with the cooling rack having the controller functioning as the main cooling rack and the other cooling racks functioning as subservient cooling racks. In yet another embodiment, the operation of the cooling system may be operated under the control of an integrated data center control and monitoring system with each cooling rack having a controller unit 90a that communicates with the other cooling racks over the network. In one such embodiment, the controller 90 may communicate with a data center control system to provide status of the components of the cooling system and to receive control commands for the data center control system. In one embodiment. each cooling rack includes a controller that communicates with the data center controller over a network, such as a CAN Bus network, and in one such embodiment, the data center controller may be implemented using the integrated data center control and monitoring system, such as the InfraStruXure™ data center manager sold by American Power Conversion Corporation of West Kingston, R.I., the assignee of the present invention. Notwithstanding the particular configuration, the controller 90 is adapted to control the flow of coolant from the distribution box 56 to the cooling racks 50. After installation, the cooling system may be tested for quality purposes. Once successfully tested, insulation material (not shown) may be provided over the flexible tubing 64. In one embodiment, the flexible tubing 64 may be inserted into the insulation. In another embodiment, the insulation may be split and applied over the flexible tubing.

In certain embodiments, the cooling system of the present invention may take the form of a kit for cooling a data center. Depending on the volume of space of the data center, the components of the kit are scaleable to meet the cooling requirements of the data center. In one embodiment, the kit comprises a predetermined number of cooling racks adapted to be interspersed within rows of equipment racks in the data center. The cooling racks may embody the cooling rack 50 described above. The kit may further include flexible tubing having predetermined lengths to connect each cooling rack to the distribution box, and clamps used to support and otherwise secure the flexible tubes to the data center structures. In one embodiment, the kit includes at least one cooling rack for every two electronic equipment racks housed in the data center. The kit may further include a distribution box or boxes, depending on the cooling requirements.

One further benefit to the cooling system of embodiments of the present invention is that during the planning of the original design, the flexible tubing may be planned for all current and future requirements, even if the future requirements for cooling equipment is not installed. For example, the future plan may be based on a worse case (i.e., maximum) cooling requirement. The distribution box and some overhead flexible tubing, support members and clamps may be made in the future design, even if no cooling racks are installed at that particular time. In such a system, provision is made for filling this tubing with water and removing all air from the tubing without shutting down the distribution box, which is already supplying the existing cooling racks with coolant. In this way, additional cooling racks may be added in the future without shutting down the cooling system.

Thus, it should be observed that the cooling system of the present invention is particularly configured for scaleable and modular implementation within a data center. The cooling system may be provided in kit form that may be installed by personnel having no particular training in cooling system installation and no specialized tools. One benefit of the cooling system is that cooling racks may be movable within a data center, or to another data center, when environmental conditions or needs within the data center change.

In addition, since the cooling rack of the cooling system may be provided as an in-row product, the cooling rack may be positioned to intake the hottest air in the data center and to cool it slightly below ambient temperature. This design feature eliminates the inefficiency of mixing hot air with the room temperature air to get a warm mixture. The design also significantly decreases latent cooling provided by the air conditioner, thereby potentially eliminating the need for humidification. The improvements to efficiency may best be seen by the fact that the foot print of a cooling unit (i.e., the cooling rack) may be decreased by up to thirty percent to obtain the same cooling performance. Specifically, the provision of movable cooling racks having casters and leveling feet, and having the flexible tubing provided over the cooling rack rather than being permanently tied into the cooling rack improves the efficiency and the scalability of the cooling system. To assist the operator in optimizing the locations of the cooling racks, the cooling capacity of each unit may be monitored by the operator, along with the flow rate, water and air inlet and outlet temperatures, and pressure differentials. These readings enable the operator to place the cooling racks where each cooling rack may neutralize the maximum amount of heat, while providing higher flexibility to the operator in the room design and layout and removing the constraint of having air conditioners positioned around the periphery of the data center. From a power perspective, each cooling rack operates under direct current, thus providing some level of flexibility to the input power provided. Thus, a cooling unit no longer needs to be built for a specific voltage.

As described above, the cooling system of embodiments of the invention may be further provided as part of an integrated data center control and monitoring system. When used with such an integrated control and monitoring system, the cooling system of the present invention enables easy removal of a cooling rack or racks for service and relocation to another position within the data center. The cooling system may also be integrated into an existing cooling system of the building housing the data center, for example and used in conjunction with one or more CRAC units to provide additional cooled air where needed in the data center.

The cooling system may be provided with a predictive failure determination module by utilizing a number of factors. Specifically, through the controller, each cooling rack may be designed to notify the data center operator when certain parts, such as motors, fans, or any other part subject to wear, are near the ends of their useful life. The provision of such a module will enable a reasonably timed preventative maintenance action to be performed and to save possible downtime. The notification may be delivered to the display of the rack, or provided to the operator of the data center through the integrated control and monitoring system. In addition, a controller of the cooling system configured as a main controller may compensate for a failure of a particular cooling rack by increasing the output of other cooling racks positioned near the failed cooling rack.

With the cooling system of embodiments of the present invention, it is observed that the need for a raised floor is eliminated. Data room operators are willing to include flexible tubing overhead, since soldered joints, which are susceptible to failing, are no longer required. By eliminating the raised floor, costs associated with designing and providing the raised floor are eliminated. In addition, the equipment housed by the equipment racks may be better anchored to the floor of the data center for enhanced earthquake resistance. The flexible tubing is now visible and may be inspected easily by data center personnel, for example. The number of suitable sites for server rooms or data centers is increased because rooms with relatively low headroom may now be utilized. Additionally, the need for raised floor ramps is eliminated. It should be noted, however, that at least some of the embodiments described above may be used in data centers having raised floors and the flexible tubing associated with such cooling systems may run beneath the raised floor.

The cooling system of embodiments of the present invention is faster to install than prior systems. Some, if not all of the flexible tubing may be estimated in advance and provided to the site in kit form. In addition, since flexible tubing is employed, the flexible tubing and the couplings and clamps used to connect the flexible tubing to the distribution box and their respective cooling racks require less interconnection work and enhance the neatness of the appearance of the cooling system. Thus, the data center looks more professional.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A system for cooling a data center having a volume of space designed to house a plurality of electronic equipment racks, each equipment rack being arranged in a row and having a housing adapted to support at least one piece of electronic equipment, the system comprising:

a plurality of cooling racks, each cooling rack comprising a housing and cooling system components supported by the housing;

a fluid communication system coupled to the cooling system components of the plurality of racks, the fluid communication system being configured to provide chilled coolant to and exhaust heated coolant from coolant system components of each cooling rack:

at least one controller coupled to each cooling rack of the plurality of cooling racks to control operation of each cooling rack;

a control valve, operably coupled to the controller, to control flow of coolant to the at least one cooling rack; and a monitor, operably coupled to the controller, to measure environmental conditions of the volume of space, wherein the plurality of cooling racks and the fluid communication system are configured to be modular to allow placement of cooling racks in different locations in a row of equipment racks within the volume of space of the data center, and wherein the controller is configured to determine the cooling capacity of each cooling rack and display the capacity on the monitor.

2. A system for cooling a data center having a volume of space designed to house a plurality of electronic equipment racks, each equipment rack being arranged in a row and having a housing adapted to support at least one piece of electronic equipment, the system comprising:

a plurality of cooling racks, each cooling rack comprising a housing and cooling system components supported by the housing;

a fluid communication system coupled to the cooling system components of the plurality of racks, the fluid communication system being configured to provide chilled coolant to and exhaust heated coolant from coolant system components of each cooling rack; and at least one controller coupled to each cooling rack of the plurality of cooling racks to control operation of each cooling rack, wherein the plurality of cooling racks and the fluid communication system are configured to be modular to allow placement of cooling racks in different locations in a row of equipment racks within the volume of space of the data center, and wherein the controller is a main controller that includes a controller unit provided in one of the plurality of cooling racks.

* * * * *